(12) United States Patent
Lee et al.

(10) Patent No.: US 11,469,244 B2
(45) Date of Patent: Oct. 11, 2022

(54) THREE-DIMENSIONAL SEMICONDUCTOR MEMORY DEVICE

(71) Applicant: Samsung Electronics Co., Ltd., Suwon-si (KR)

(72) Inventors: Seunghwan Lee, Seoul (KR); Suhyeong Lee, Suwon-si (KR); Ju-Young Lim, Seoul (KR); Daehyun Jang, Hwaseong-si (KR); Sanghoon Jeong, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/853,838

(22) Filed: Apr. 21, 2020

(65) Prior Publication Data

US 2021/0074719 A1 Mar. 11, 2021

(30) Foreign Application Priority Data

Sep. 10, 2019 (KR) .................. 10-2019-0112099

(51) Int. Cl.
| H01L 27/11582 | (2017.01) |
| H01L 27/11519 | (2017.01) |
| H01L 27/11524 | (2017.01) |
| H01L 27/11573 | (2017.01) |
| H01L 27/11556 | (2017.01) |
| H01L 27/11565 | (2017.01) |
| H01L 27/1157 | (2017.01) |
| H01L 27/11529 | (2017.01) |

(52) U.S. Cl.
CPC .... *H01L 27/11582* (2013.01); *H01L 27/1157* (2013.01); *H01L 27/11519* (2013.01); *H01L 27/11524* (2013.01); *H01L 27/11529* (2013.01); *H01L 27/11556* (2013.01); *H01L 27/11565* (2013.01); *H01L 27/11573* (2013.01)

(58) Field of Classification Search
None
See application file for complete search history.

(56) References Cited

U.S. PATENT DOCUMENTS

| 9,159,845 | B2 | 10/2015 | Ramaswamy |
| 9,768,270 | B2 | 9/2017 | Gunji-Yoneoka et al. |
| 9,837,349 | B2 * | 12/2017 | Song .................. H01L 23/5226 |
| 10,032,935 | B2 | 7/2018 | Higuchi et al. |
| 10,083,981 | B2 | 9/2018 | Daycock et al. |

(Continued)

*Primary Examiner* — Hsien Ming Lee
(74) *Attorney, Agent, or Firm* — Harness, Dickey & Pierce, P.L.C.

(57) ABSTRACT

Disclosed is a three-dimensional semiconductor memory device comprising intergate dielectric layers and electrode layers alternately stacked on a substrate, a vertical semiconductor pattern that penetrate the intergate dielectric layers and the electrode layers and extends into the substrate, blocking dielectric patterns between the vertical semiconductor pattern and the electrode layers, a tunnel dielectric layer between the blocking dielectric patterns and the vertical semiconductor pattern and in contact with the blocking dielectric patterns and simultaneously with the intergate dielectric layers, and first charge storage patterns between the blocking dielectric patterns and the tunnel dielectric layer. One of the first charge storage patterns is in contact with top and bottom surfaces of one of the blocking dielectric patterns.

20 Claims, 31 Drawing Sheets

(56) References Cited

U.S. PATENT DOCUMENTS

| | | |
|---|---|---|
| 10,249,641 B2 | 4/2019 | Hirotani et al. |
| 10,276,586 B2 | 4/2019 | Murakoshi et al. |
| 10,283,646 B2 | 5/2019 | Sawa et al. |
| 2018/0047743 A1 | 2/2018 | Kwon |

* cited by examiner

THREE-DIMENSIONAL SEMICONDUCTOR MEMORY DEVICE

CROSS-REFERENCE TO RELATED APPLICATION

This U.S. nonprovisional application claims priority under 35 U.S.C § 119 to Korean Patent Application No. 10-2019-0112099 filed on Sep. 10, 2019, in the Korean Intellectual Property Office, the disclosures of which are hereby incorporated by reference in their entirety.

BACKGROUND

The present inventive concepts relate to a three-dimensional semiconductor memory device.

Semiconductor devices have been highly integrated to meet higher performance and/or lower manufacturing cost which may be required by customers. Because integration of the semiconductor devices is a factor in determining product price, higher integration is increasingly requested. Integration of typical two-dimensional or planar semiconductor devices is primarily determined by the area occupied by a unit memory cell, such that it is influenced by the level of technology for forming fine patterns. However, the expensive processing equipment needed to increase pattern fineness may set a practical limitation on increasing the integration of the two-dimensional or planar semiconductor devices. Therefore, there have been proposed three-dimensional semiconductor memory devices having three-dimensionally arranged memory cells.

SUMMARY

Some example embodiments of the present inventive concepts provide three-dimensional semiconductor memory devices with increased reliability.

An object of the present inventive concepts is not limited to the mentioned above, and other objects which have not been mentioned above will be clearly understood to those skilled in the art from the following description.

According to some example embodiments of the present inventive concepts, a three-dimensional semiconductor memory device may comprise: a plurality of intergate dielectric layers and a plurality of electrode layers alternately stacked on a substrate; a vertical semiconductor pattern that penetrates the intergate dielectric layers and the electrode layers, the vertical semiconductor pattern extending into the substrate; a plurality of blocking dielectric patterns between the vertical semiconductor pattern and the electrode layers, respectively, the plurality of blocking dielectric patterns spaced apart from each other; a tunnel dielectric layer between the blocking dielectric patterns and the vertical semiconductor pattern, the tunnel dielectric layer in contact with the blocking dielectric patterns and simultaneously with the intergate dielectric layers; and a plurality of first charge storage patterns between the blocking dielectric patterns and the tunnel dielectric layer, respectively, the first charge storage patterns spaced apart from each other. One of the first charge storage patterns may be in contact with a top surface and a bottom surface of one of the blocking dielectric patterns.

According to some example embodiments of the present inventive concepts, a three-dimensional semiconductor memory device may comprise: a substrate on a peripheral logic structure; a source pattern on the substrate; a plurality of intergate dielectric layers and a plurality of electrode layers are alternately stacked on the source pattern; a vertical semiconductor pattern that penetrates the intergate dielectric layers, the electrode layers, and the source pattern, the vertical semiconductor pattern extending into the substrate; a plurality of blocking dielectric patterns between the vertical semiconductor pattern and the electrode layers, respectively, the blocking dielectric patterns spaced apart from each other; a tunnel dielectric layer between the blocking dielectric patterns and the vertical semiconductor pattern, the tunnel dielectric layer in contact with the blocking dielectric patterns and simultaneously with the intergate dielectric layers; and a plurality of first charge storage patterns between the blocking dielectric patterns and the tunnel dielectric layer, respectively, the first charge storage patterns spaced apart from each other. One of the first charge storage patterns may be in contact with a sidewall of one of the blocking dielectric patterns and simultaneously with a sidewall of the intergate dielectric layer adjacent to the one of the first charge storage pattern.

According to some example embodiments of the present inventive concepts, a three-dimensional semiconductor memory device may comprise: a plurality of intergate dielectric layers and a plurality of electrode layers alternately stacked on a substrate; a vertical semiconductor pattern that penetrates the intergate dielectric layers and the electrode layers, the vertical semiconductor pattern extending into the substrate; a plurality of blocking dielectric patterns between the vertical semiconductor pattern and the electrode layers, respectively, the blocking dielectric patterns spaced apart from each other; a tunnel dielectric layer between the blocking dielectric patterns and the vertical semiconductor pattern, the tunnel dielectric layer in contact with the blocking dielectric patterns and simultaneously with the intergate dielectric layers; and a plurality of first charge storage patterns between the blocking dielectric patterns and the tunnel dielectric layer, respectively, the first charge storage patterns spaced apart from each other. A vertical length of one of the first charge storage patterns may be greater than a vertical length of one of the blocking dielectric patterns. The one of the blocking dielectric patterns may be in contact with the one of the first charge storage patterns.

DETAILED DESCRIPTION OF EMBODIMENTS

Some example embodiments of the present inventive concepts will now be described in detail with reference to the accompanying drawings to aid in clearly explaining the present inventive concepts.

Figure 1:
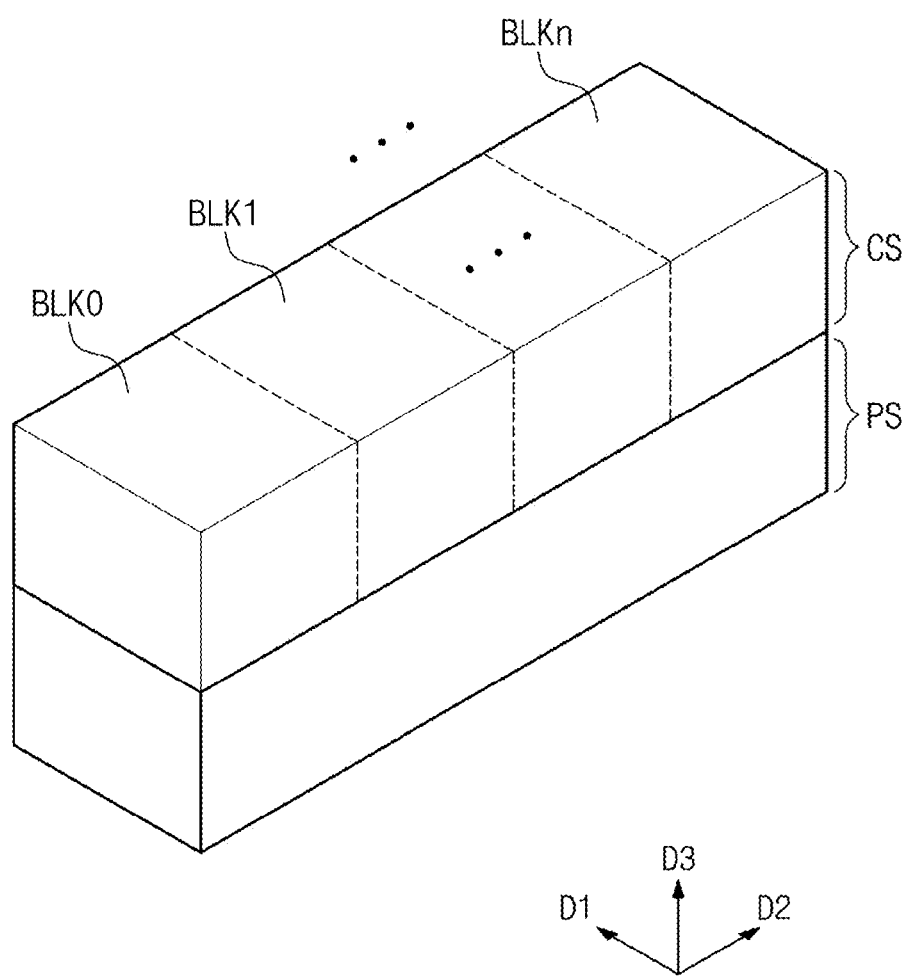
FIG. 1 illustrates a block diagram showing a three-dimensional semiconductor memory device according to some example embodiments of the present inventive concepts.

FIG. 1 illustrates a block diagram showing a three-dimensional semiconductor memory device according to some example embodiments of the present inventive concepts.

Referring to FIG. 1, a three-dimensional semiconductor memory device according to some example embodiments of the present inventive concepts may include a peripheral logic structure PS, a cell array structure CS on the peripheral logic structure PS, and/or a connection line structure that connects the cell array structure CS to the peripheral logic structure PS.

The peripheral logic structure PS may include row and column decoders, a page buffer, and/or control circuits.

When viewed in plan, the cell array structure CS may overlap the peripheral logic structure PS. The cell array structure CS may include a plurality of memory blocks BLK0 to BLKn each of which is a data erasure unit. Each of the memory blocks BLK0 to BLKn may include a memory cell array having a three-dimensional structure (or vertical structure).

Figure 2:
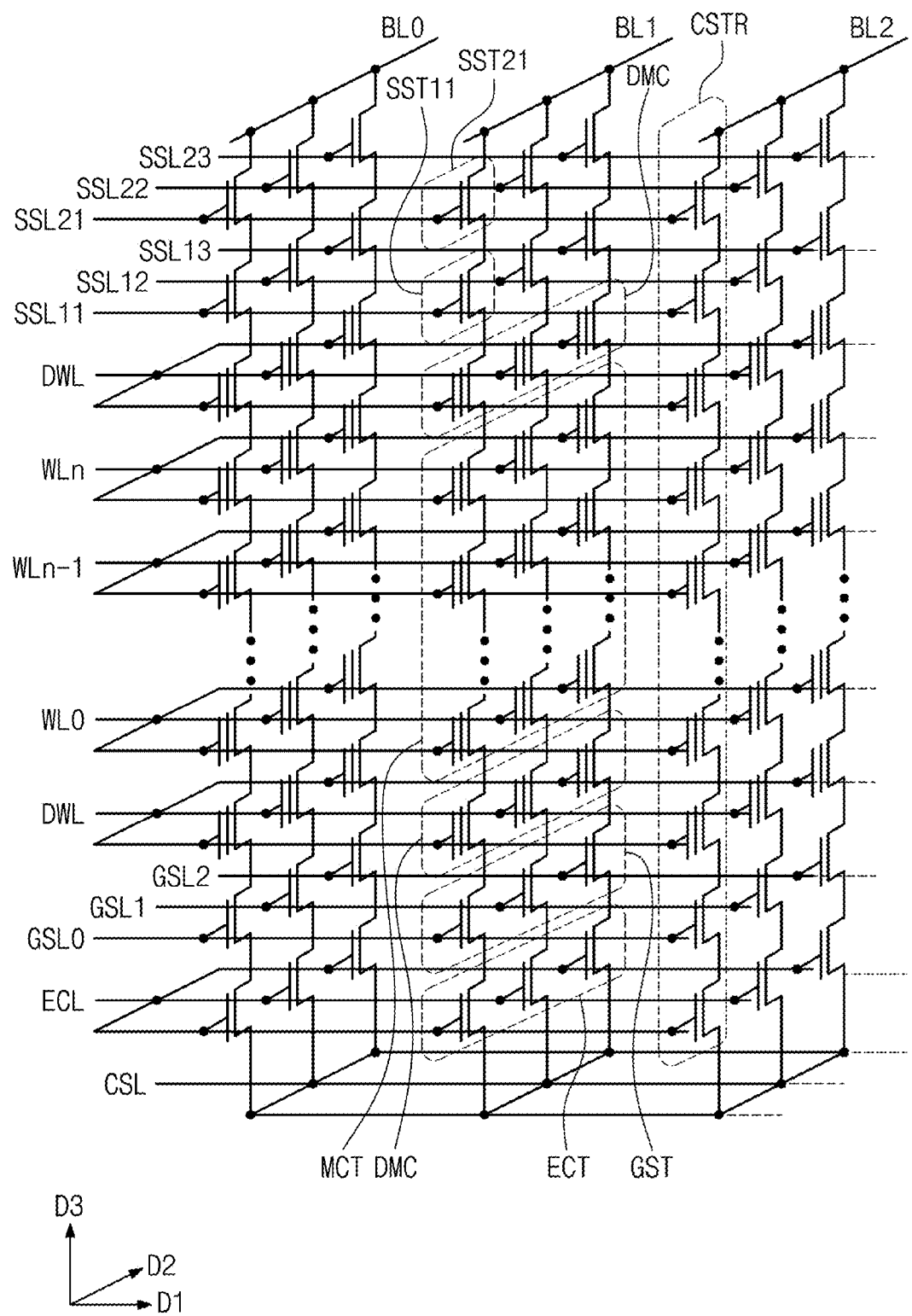
FIG. 2 illustrates a circuit diagram showing a cell array of a three-dimensional semiconductor memory device according to some example embodiments of the present inventive concepts.

FIG. 2 illustrates a circuit diagram showing a cell array of a three-dimensional semiconductor memory device according to some example embodiments of the present inventive concepts.

Referring to FIG. 2, on each of the memory blocks BLK0 to BLKn, cell strings CSTR may be two-dimensionally arranged along first and second directions D1 and D2 and may extend along a third direction D3. A plurality of cell strings CSTR may be connected in parallel to each of bit lines BL0 to BL2. The plurality of cell strings CSTR may be connected in common to a common source line CSL.

One of the cell strings CSTR may include string select transistors SST21 and SST11 connected in series, memory cell transistors MCT connected in series, a ground select transistor GST, and an erase control transistor ECT. Each of the memory cell transistors MCT may include a data storage element. The one of the cell strings CSTR may further include dummy cells DMC between the string select transistor SST11 and the memory cell transistor MCT and between the ground select transistor GST and the memory cell transistor MCT. Other cell strings CSTR may have an identical or similar structure to that discussed above.

The string select transistor SST11 may be controlled by a string select line SSL11, and the string select transistor SST21 may be controlled by a string select line SSL21. The memory cell transistors MCT may be controlled by corresponding word lines WL0 to WLn, and the dummy cell transistors DMC may be controlled by corresponding dummy word lines DWL. The ground select transistor GST may be controlled by a ground select line GSL0, GSL1, or GSL2, and the erase control transistor ECT may be controlled by an erase control line ECL.

The memory cells MCT may include gate electrodes, which are spaced apart at the same or substantially the same distance from the common source lines CSL, connected in common to one of the word lines WL0 to WLn and DWL to thereby have an equipotential state. In contrast, although the gate electrodes of the memory cells MCT are spaced apart at the same or substantially the same distance from the common source lines CSL, the gate electrodes at different row or column may be independently controlled of each other.

Figure 3:
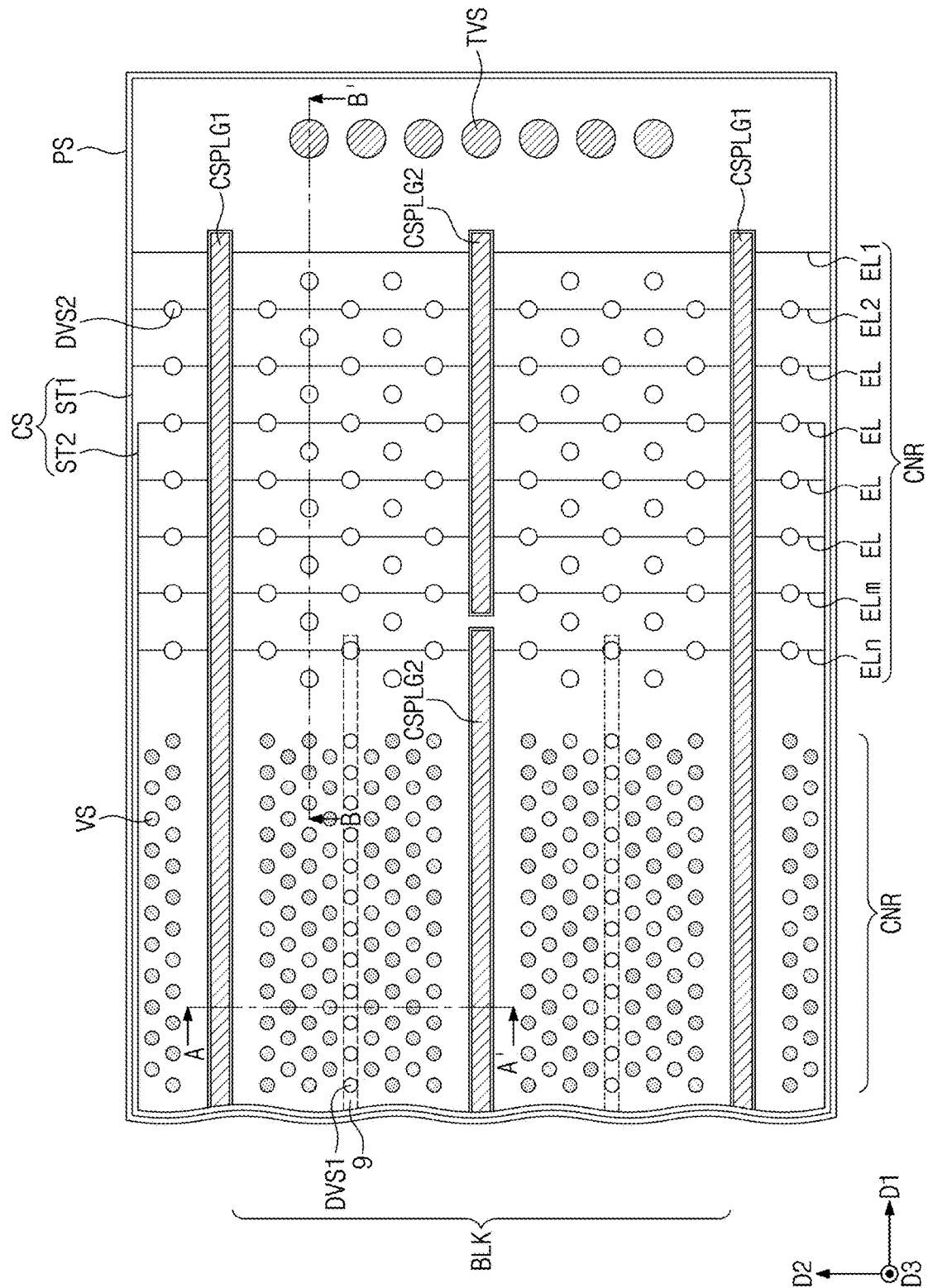
FIG. 3 illustrates a plan view showing a three-dimensional semiconductor device according to some example embodiments of the present inventive concepts.
Figure 4:
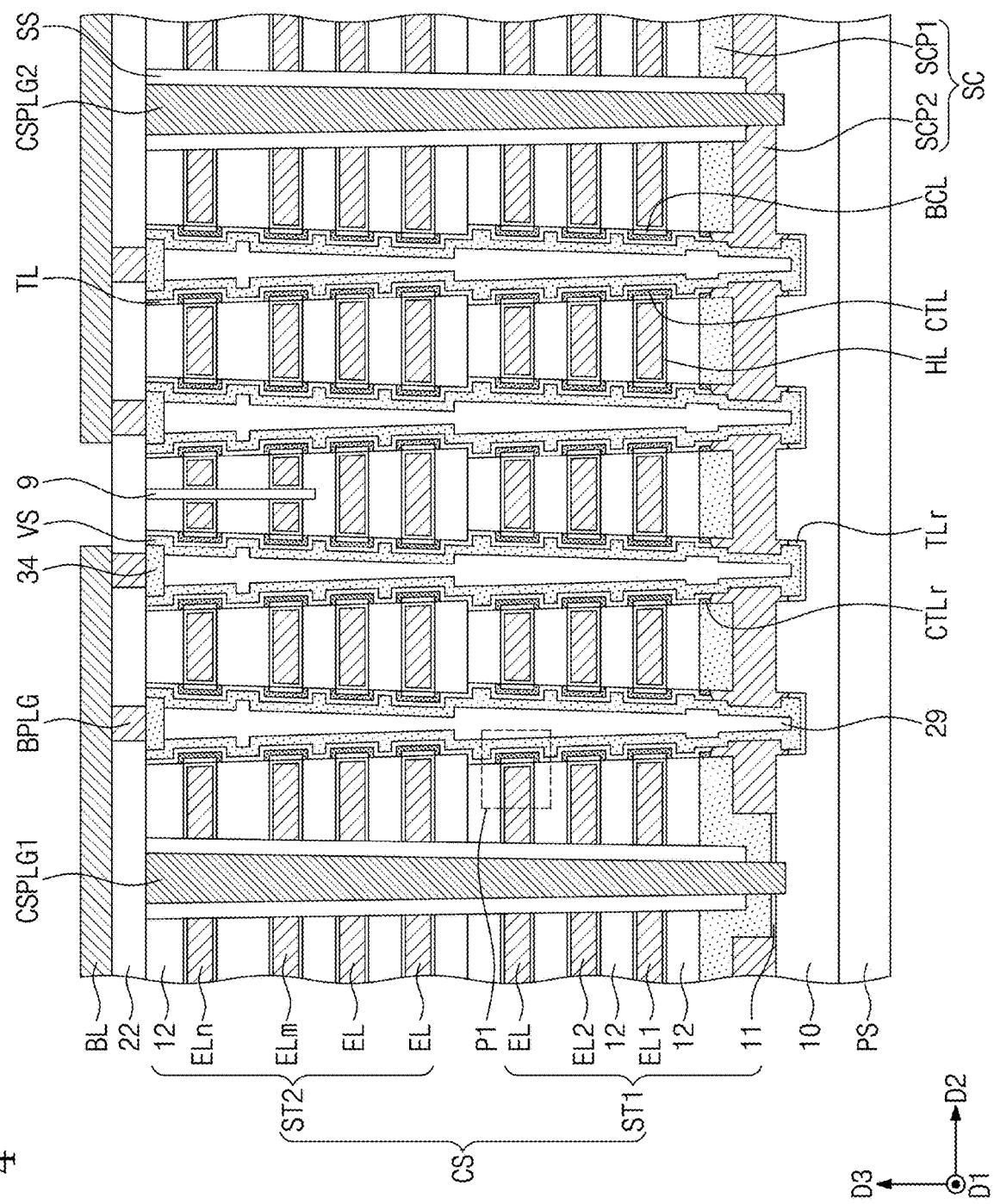
FIG. 4 illustrates a cross-sectional view taken along line A-A' of FIG. 3.
Figure 5:
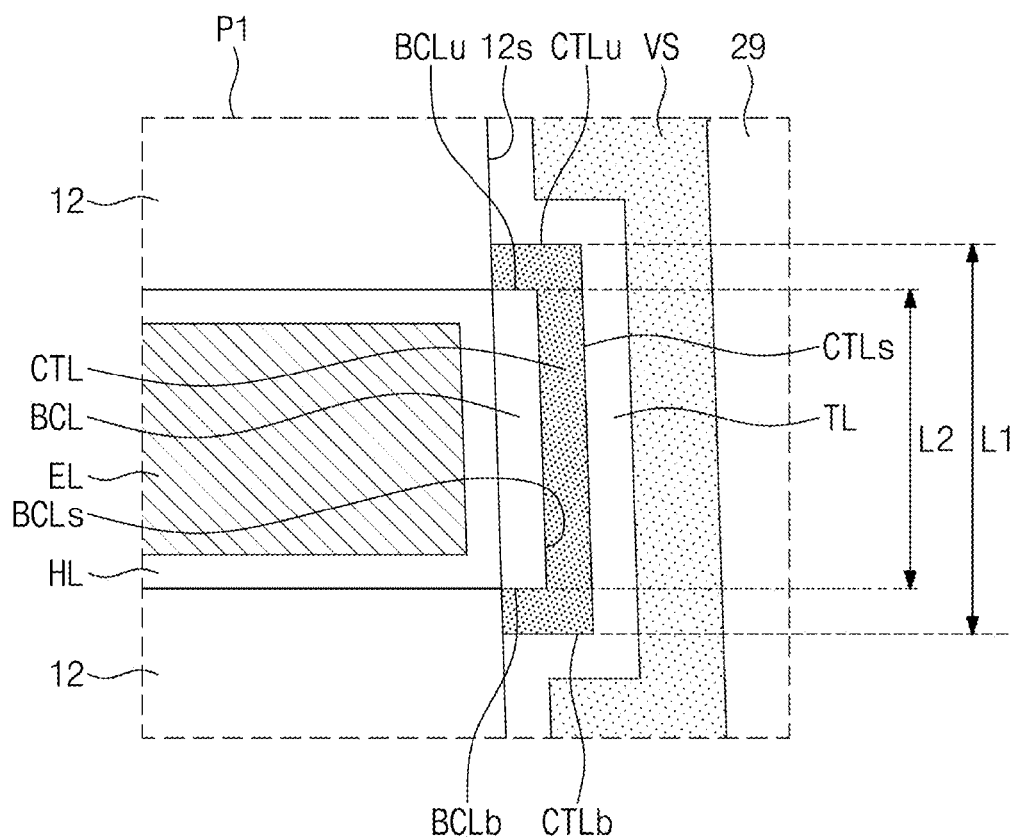
FIG. 5 illustrates an enlarged view showing section P1 of FIG. 4.
Figure 6:
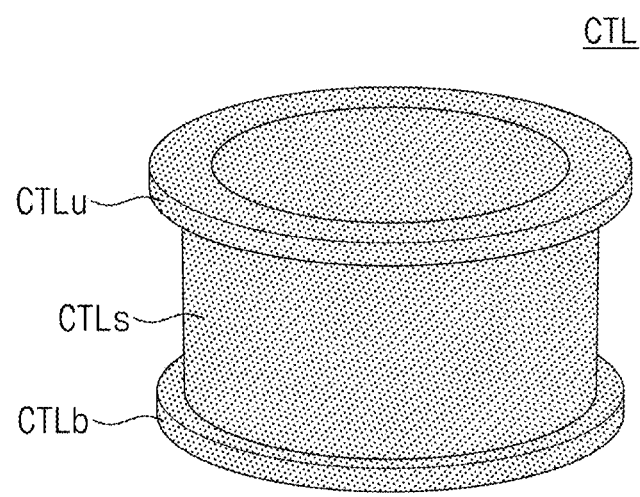
FIG. 6 illustrates a perspective view showing a charge storage pattern of FIG. 5.
Figure 7:
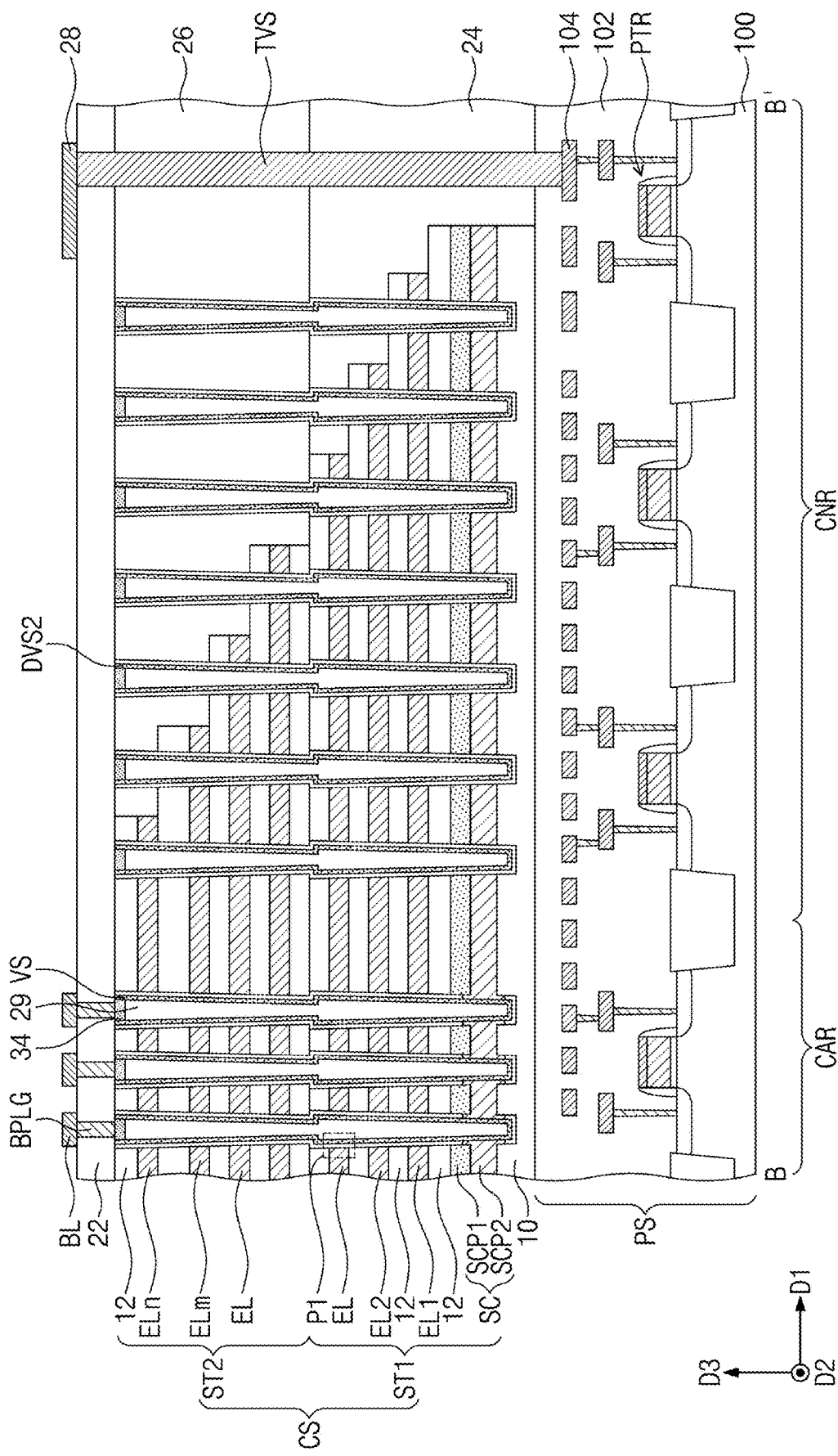
FIG. 7 illustrates a cross-sectional view taken along line B-B' of FIG. 3.

FIG. 3 illustrates a plan view showing a three-dimensional semiconductor device according to some example embodiments of the present inventive concepts. FIG. 4 illustrates a cross-sectional view taken along line A-A' of FIG. 3. FIG. 5 illustrates an enlarged view showing section P1 of FIG. 4. FIG. 6 illustrates a perspective view showing a charge storage pattern of FIG. 5. FIG. 7 illustrates a cross-sectional view taken along line B-B' of FIG. 3.

Referring to FIGS. 3 to 7, a cell array structure CS may be disposed on a peripheral logic structure PS. The peripheral logic structure PS may include a first substrate 100, peripheral transistors PTR, a peripheral interlayer dielectric layer 102, and/or peripheral connection lines 104 in the peripheral interlayer dielectric layer 102 and electrically connected to the peripheral transistors PTR. FIG. 4 omits an illustration of internal configuration of the peripheral logic structure PS, but the internal configuration may be identical or similar to the internal structure of the peripheral logic structure PS shown in FIG. 7.

The cell array structure CS may include a second substrate 10. The second substrate 10 may be one of a semiconductor material (e.g., silicon wafer), a dielectric material (e.g., glass), and a semiconductor or conductor covered with a dielectric material. The second substrate 10 may be a semiconductor layer. The second substrate 10 may include a cell array region CAR and a connection region CNR. The connection region CNR may be located at an edge of the cell array region CAR.

FIG. 3 shows the cell array structure CS that corresponds to a single block structure BLK which is one of the memory blocks BLK0 to BLKn shown in FIG. 1. First source contact plugs CSPLG1 may be disposed between neighboring block structures BLK. In addition, a second source contact plug CSPLG2 may be disposed on a central portion of the block structure BLK and may divide the block structure BLK into two pieces in a second direction D2. When viewed in plan as shown in FIG. 3, the first source contact plug CSPLG1 may have a linear shape that is continuously elongated in a first direction D1. On the other hand, the second source contact plugs CSPLG2 may have a discontinuous section (or cut area) on the connection region CNR. The block structure BLK and the first and second source contact plugs CSPLG1 and CSPLG2 may have therebetween dielectric spacers SS made of a dielectric material. The first and second source contact plugs CSPLG1 and CSPLG2 may include, for example, at least one selected from doped semiconductor (e.g., doped silicon), metal (e.g., tungsten, copper, or aluminum), conductive metal nitride (e.g., titanium nitride or tantalum nitride), and transition metal (e.g., titanium or tantalum).

The block structure BLK may include a first stack ST1 on the second substrate 10 and a second stack ST2 on the first stack ST1. The first stack ST1 may include a source structure SC adjacent to the second substrate 10. The source structure SC may include a first source pattern SCP1 spaced apart from the second substrate 10 and a second source pattern SCP2 between the first source pattern SCP1 and the second substrate 10. The first source pattern SCP1 may include an impurity-doped semiconductor pattern, for example, impurity-doped polysilicon. The second source pattern SCP2 may include an impurity-doped semiconductor pattern, for example, impurity-doped polysilicon. The second source pattern SCP2 may further include a semiconductor material different from that of the first source pattern SCP1. The impurity doped in the second source pattern SCP2 may have the same conductivity type as that of the impurity doped in the first source pattern SCP1. The impurity doped in the second source pattern SCP2 may have concentration the same as or different from that of the impurity doped in the first source pattern SCP1.

The second stack ST2 may be covered with an upper dielectric layer 22. The first and second stacks ST1 and ST2 may include electrode layers EL1, EL2, EL, ELm, and ELn and intergate dielectric layers 12 that are alternately stacked. The electrode layers EL1, EL2, EL, ELm, and ELn may include a first electrode layer EL1, a second electrode layer EL2, an intermediate electrode layer EL, an $m^{th}$ electrode layer ELm, and an $n^{th}$ electrode layer ELn in the sequence from bottom to top. The first stack ST1 may have the first electrode layer EL1, the second electrode layer EL2, and one or more of the intermediate electrode layers EL, and the second stack ST2 may have the rest of the intermediate electrode layers EL, the $m^{th}$ electrode layer ELm, and the $n^{th}$ electrode layer ELn.

The first electrode layer EL1 may correspond to, for example, the erase control line ECL of FIG. 2. The second electrode layer EL2 may correspond to, for example, one of the ground select lines GSL0, GSL1, and GSL2. The intermediate electrode layers EL may correspond to the word lines WL0 to WLn of FIG. 2. A separation dielectric pattern 9 and the second source contact plug CSPLG2 may divide the $m^{th}$ electrode layer ELm into a plurality of lines, which correspond to the string select lines SSL11, SSL12, and SSL13 that extend in the first direction D1 and are spaced apart from each other in the second direction D2 as shown in FIG. 2. The separation dielectric pattern 9 and the second source contact plug CSPLG2 may divide the $n^{th}$ electrode layer ELn into a plurality of lines, which correspond to the string select lines SSL21, SSL22, and SSL23 that extend in the first direction D1 and are spaced apart from each other in the second direction D2 as shown in FIG. 2. The electrode layers EL1, EL2, EL, ELm, and ELn may include, for example, at least one selected from doped semiconductor (e.g., doped silicon, etc.), metal (e.g., tungsten, copper, aluminum, etc.), conductive metal nitride (e.g., titanium nitride, tantalum nitride, etc.), and transition metal (e.g., titanium, tantalum, etc.).

On the cell array region CAR, the first source contact plug CSPLG1 may penetrate the intergate dielectric layers 12 and the electrode layers EL1, EL2, EL, ELm, and ELn and may have electrical connection with the source structure SC. The first source contact plug CSPLG1 may be in contact with a first source pattern SCP1 of the source structure SC, but may be spaced apart from a second source pattern SCP2 of the source structure SC. The first source pattern SCP1 may be in contact with a sidewall of the second source pattern SCP2. A buffer dielectric layer 11 may be interposed between the second substrate 10 and the first source pattern SCP1 adjacent to the first source contact plug CSPLG1. On the cell array region CAR, the second source contact plug CSPLG2 may penetrate the intergate dielectric layers 12 and the electrode layers EL1, EL2, EL, ELm, and ELn and may have electrical connection with the source structure SC. The second source contact plug CSPLG2 may be spaced apart from the first source pattern SCP1 across the dielectric spacer SS, but may be in contact with the second source pattern SCP2. The dielectric spacer SS may be interposed between the electrode layers EL1, EL2, EL, ELm, and ELn and the first and second source contact plugs CSPLG1 and CSPLG2. In FIGS. 3, 4, and 7, although seven electrode layers EL1, EL2, EL, ELm, and ELn are illustrated for convenience of description, the number of the electrode layers EL1, EL2, EL, ELm, and ELn is not limited thereto, but may be greater than 7.

As shown in FIG. 3, a plurality of vertical semiconductor patterns VS and a plurality of first dummy vertical semiconductor patterns DVS1 may be disposed on the cell array region CAR. The first dummy vertical semiconductor patterns DVS1 may be linearly disposed along the first direction D1 on a central portion of one section of the block structure BLK. The separation dielectric patterns 9 may be disposed between upper portions of the first dummy vertical semiconductor patterns DVS1.

Referring to FIGS. 3 and 7, the block structure BLK may have a stepwise structure on the connection region CNR. For example, the electrode layers EL1, EL2, EL, ELm, and ELn may have their lengths in the first direction D1 that decrease with increasing distance from the second substrate 10. Each of the electrode layers EL1, EL2, EL, ELm, and ELn may have a pad portion (not shown) on the connection region CNR. The first stack ST1 may further include a first interlayer dielectric layer 24 that cover end portions of the electrode layers EL1, EL2, and EL. The first interlayer dielectric layer 24 may have a top surface coplanar with that of the first stack ST1. The second stack ST2 may include a second interlayer dielectric layer 26 that covers end portions of the electrode layers EL, ELm, and ELn and also covers the first interlayer dielectric layer 24. The second interlayer dielectric layer 26 may have a top surface coplanar with that of the second stack ST2.

On the connection region CNR, a plurality of second dummy vertical semiconductor patterns DVS2 may be disposed to penetrate the first and second stacks ST1 and ST2 and to extend into the second substrate 10. The second dummy vertical semiconductor patterns DVS2 may have their widths greater than those of the vertical semiconductor patterns VS and those of the first dummy vertical semiconductor patterns DVS1. The vertical semiconductor patterns VS and the first and second dummy vertical semiconductor patterns DVS1 and DVS2 may all include a single-crystalline or polycrystalline silicon layer doped or not doped with impurities. The vertical semiconductor patterns VS and the first and second dummy vertical semiconductor patterns DVS1 and DVS2 may each have a hollow shell shape. The vertical semiconductor patterns VS and the first and second dummy vertical semiconductor patterns DVS1 and DVS2 may have their insides each of which is filled with a buried dielectric pattern 29.

Conductive pads 34 may be provided on corresponding upper portions of the vertical semiconductor patterns VS and the first and second dummy vertical semiconductor patterns DVS1 and DVS2. The conductive pad 34 may be an impurity-doped region or may be made of a conductive material. The conductive pad 34 on each of the vertical semiconductor patterns VS may be connected to a bit line BL through a bit-line contact BPLG that penetrates the upper dielectric layer 22. In contrast, the conductive pad 34 on each of the first and second dummy vertical semiconductor patterns DVS1 and DVS2 may not be connected to the bit line BL. The vertical semiconductor patterns VS and the first and second dummy vertical semiconductor patterns DVS1 and DVS2 may have their sidewalls each of which has an inflection point at which a slope is changed between the first stack ST1 and the second stack ST2.

A plurality of through vias TVS may be disposed on an edge of the connection region CNR. The upper dielectric layer 22 may be provided thereon with connection lines 28 connected to the through vias TVS. The connection lines 28 may be electrically connected to the bit line BL, at least one of the electrode layers EL1, EL2, EL, ELm, and ELn, at least one of the vertical semiconductor patterns VS, and/or the first and second source contact plugs CSPLG1 and CSPLG2. The through vias TVS may penetrate the upper dielectric layer 22, the second interlayer dielectric layer 26, the first interlayer dielectric layer 24, and the peripheral interlayer dielectric layer 102, and may electrically connect the connection lines 28 to the peripheral connection lines 104.

Referring to FIGS. 4 to 6, a tunnel dielectric layer TL may be interposed between the vertical semiconductor patterns VS and the electrode layers EL1, EL2, EL, ELm, and ELn. A charge storage pattern CTL may be interposed between the tunnel dielectric layer TL and the electrode layers EL1, EL2, EL, ELm, and ELn. A blocking dielectric pattern BCL may be interposed between the charge storage pattern CTL and the electrode layers EL1, EL2, EL, ELm, and ELn. A high-k dielectric layer HL may be interposed between the blocking dielectric pattern BCL and the electrode layers EL1, EL2, EL, ELm, and ELn. The high-k dielectric layer HL may extend to lie between the intergate dielectric layers 12 and the electrode layers EL1, EL2, EL, ELm, and ELn.

The tunnel dielectric layer TL and the blocking dielectric pattern BCL may include, for example, a silicon oxide layer. The charge storage pattern CTL may include, for example, a silicon nitride layer, a silicon oxynitride layer, a silicon-rich nitride layer, a nano-crystalline silicon layer, and a laminated trap layer, a polysilicon layer, a variable resistance layer, or a phase change layer. The high-k dielectric layer HL may include a material, such as an aluminum oxide layer or a metal oxide layer, whose dielectric constant is greater than that of a silicon oxide layer. The high-k dielectric layer HL may have a sidewall aligned with a sidewall 12s of the intergate dielectric layer 12 adjacent to the high-k dielectric layer HL.

Referring to FIGS. 5 and 6, the tunnel dielectric layer TL may continuously extend along the vertical semiconductor pattern VS. The blocking dielectric patterns BCL, which are adjacent to corresponding electrode layers EL1, EL2, EL, ELm, and ELn, may be spaced apart from each other without being connected to each other. Each of the blocking dielectric patterns BCL may have a sidewall BCLs, a top surface BCLu, and a bottom surface BCLb. The blocking dielectric pattern BCL may protrude toward the vertical semiconductor pattern VS, compared to the sidewall 12s of the intergate dielectric layer 12 adjacent to the blocking dielectric pattern BCL. The charge storage patterns CTL, which are adjacent to corresponding blocking dielectric patterns BCL, may be spaced apart from each other without being connected to each other. The charge storage pattern CTL may have a vertical length L1 greater than a vertical length L2 of the blocking dielectric pattern BCL. The charge storage pattern CTL may be in contact with the sidewall BCLs of the blocking dielectric pattern BCL and simultaneously with a portion of the sidewall 12s of the intergate dielectric layer 12.

One charge storage pattern CTL may be in contact with the sidewall BCLs, the top surface BCLu, and the bottom surface BCLb of a corresponding one of the blocking dielectric patterns BCL. The charge storage pattern CTL may have a C-shaped cross-section. The charge storage pattern CTL may protrude toward the vertical semiconductor pattern VS, compared to the sidewall 12s of the intergate dielectric layer 12 adjacent to the charge storage pattern CTL. The charge storage pattern CTL may include a sidewall CTLs in contact with the sidewall BCLs of the blocking dielectric pattern BCL, an upper protrusion CTLu in contact with the top surface BCLu of the blocking dielectric pattern BCL, and a lower protrusion CTLb in contact with the bottom surface BCLb of the blocking dielectric pattern BCL. The upper protrusion CTLu and the lower protrusion CTLb may protrude more laterally than the sidewall CTLs. The sidewall CTLs may have a cylindrical shape. Each of the upper and lower protrusions CTLu and CTLb may have an annular shape.

In the present inventive concepts, because the charge storage patterns CTL are spaced apart from each other without being connected to each other, when a three-dimensional semiconductor memory device is operated, charges stored in the charge storage patterns CTL may be prevented from moving to neighboring charge storage patterns CTL, with the result that data loss may be avoided. As a result, it may be advantageous to conduct the operation of multi-level cell (MLC).

Furthermore, in the present inventive concepts, because the charge storage pattern CTL is in contact with the sidewall BCLs, the top surface BCLu, and the bottom surface BCLb of the blocking dielectric pattern BCL, a charge storage area may increase compared to the case where the charge storage pattern CTL is in contact only with the sidewall BCLs of the blocking dielectric pattern BCL. For example, because the charge storage pattern CTL has the C-shaped cross-section or the vertical length L1 greater than the vertical length L2 of the blocking dielectric pattern BCL, a charge storage area may increase to facilitate the operation of multi-level cell (MLC).

A section P1 of FIG. 7 may be the same as that of FIG. 5. For example, the shapes of FIG. 5 may agree with shapes of the blocking dielectric pattern BCL, the charge storage pattern CTL, the tunnel dielectric layer TL, and the high-k dielectric layer HL that are interposed between the electrode layers EL1, EL2, EL, ELm, and ELn and the first and second dummy vertical semiconductor patterns DVS1 and DVS2. An uneven structure may be formed on the sidewalls of the vertical semiconductor patterns VS and the first and second dummy vertical semiconductor patterns DVS1 and DVS2. Therefore, channel lengths may increase to reduce or prevent short channel effects. The tunnel dielectric layer TL may have an uneven structure at the cross-section thereof. The second dummy vertical semiconductor pattern DVS2 and one of the first and second interlayer dielectric layers 24 and 26 may have therebetween neither the charge storage pattern CTL nor the blocking dielectric pattern BCL, but may have only the tunnel dielectric layer TL.

The second source pattern SCP2 may be in contact with the sidewalls of the vertical semiconductor patterns VS. As shown in FIG. 4, a residual tunnel dielectric layer TLr may be interposed between the second substrate 10 and a bottom surface of the vertical semiconductor pattern VS. The second source pattern SCP2 may separate the residual tunnel dielectric layer TLr from the tunnel dielectric layer TL. A portion of the second source pattern SCP2 may extend in a third direction D3 along the sidewalls of the vertical semiconductor patterns VS. A residual dummy charge storage pattern CTLr may remain between the tunnel dielectric layer TL and an upper portion of the first source pattern SCP1.

FIGS. 8, 9A, 10A, 11, 12, 13, 14A, and 15 illustrate cross-sectional views showing a method of fabricating the three-dimensional semiconductor memory device of FIG. 4. FIG. 9B illustrates an enlarged view showing section P1 of FIG. 9A. FIG. 10B illustrates an enlarged view showing section P1 of FIG. 10A. FIG. 14B illustrates an enlarged view showing section P1 of FIG. 14A.

Figure 8:
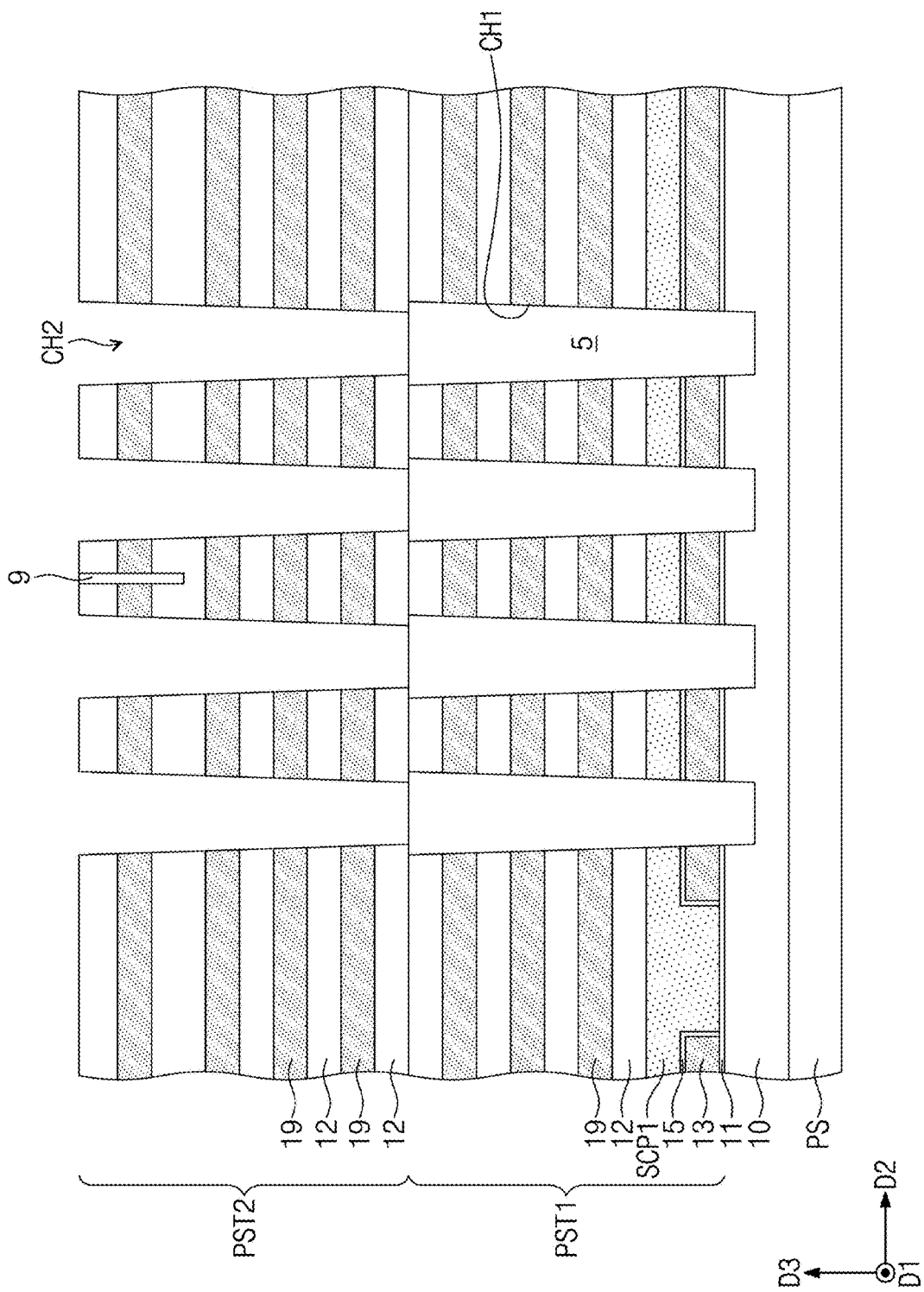
FIGS. 8, 9A, 10A, 11, 12, 13, 14A, and 15 illustrate cross-sectional views showing a method of fabricating the three-dimensional semiconductor memory device of FIG. 4.

Referring to FIG. 8, a second substrate 10 may be positioned on a peripheral logic structure PS. The second substrate 10 may be adhered to the peripheral logic structure PS. Alternatively, a deposition process may be performed to form the second substrate 10 on the peripheral logic structure PS. A buffer dielectric layer 11 may be formed on the second substrate 10. The buffer dielectric layer 11 may include, for example, a silicon oxide layer. Deposition and etching processes may be performed to form a lower sacrificial layer 13 on the buffer dielectric layer 11. An auxiliary buffer dielectric layer 15 may be formed on a top surface and a sidewall of the lower sacrificial layer 13. The auxiliary buffer dielectric layer 15 may include, for example, a silicon oxide layer. A first source pattern SCP1 may be formed on the auxiliary buffer dielectric layer 15. The first source pattern SCP1 may include, for example, an impurity-doped semiconductor layer. A first preliminary stack PST1 may be formed by alternately stacking intergate dielectric layers 12 and sacrificial layers 19 on the first source pattern SCP1. The first preliminary stack PST1 may be patterned to form a plurality of first channel holes CH1 that are spaced apart from each other. The first channel holes CH1 may be filled with buried dielectric layers 5, and then a second preliminary stack PST2 may be formed by alternately stacking intergate dielectric layers 12 and sacrificial layers 19 on the first preliminary stack PST1. The second preliminary stack PST2 may be etched to form second channel holes CH2 that overlap the first channel holes CH1. The second channel holes CH2 may expose the buried dielectric layers 5. The sacrificial layers 19 and the lower sacrificial layer 13 may be formed of a material having an etch selectivity with respect to the intergate dielectric layers 12. For example, the intergate dielectric layers 12 may be formed of a silicon oxide layer, and the sacrificial layers 19 and the lower sacrificial layer 13 may be formed of a silicon nitride layer. The second channel holes CH2 may have their lower widths less than upper widths of the first channel holes CH1.

Figure 9A:
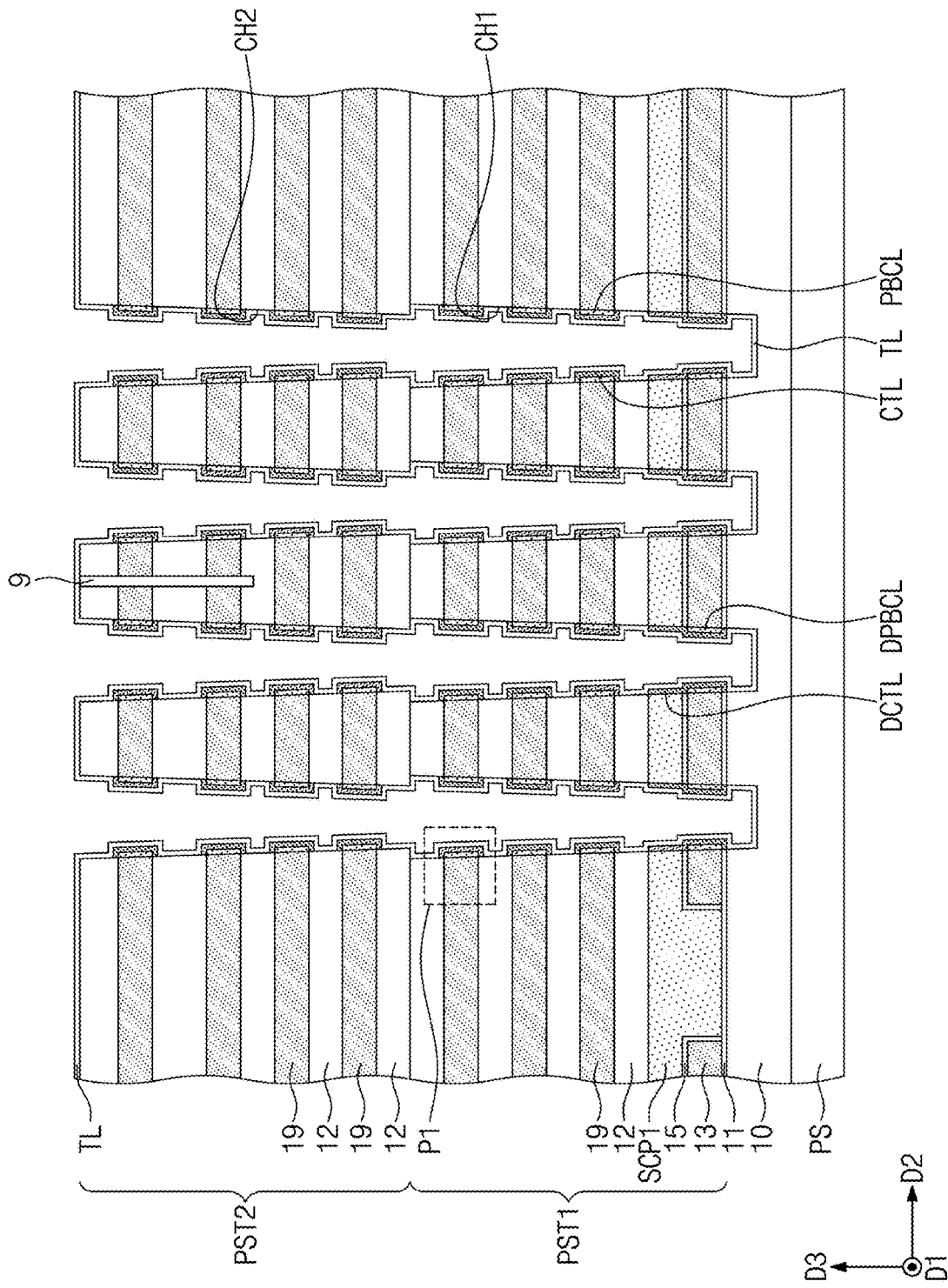
Figure 9B:
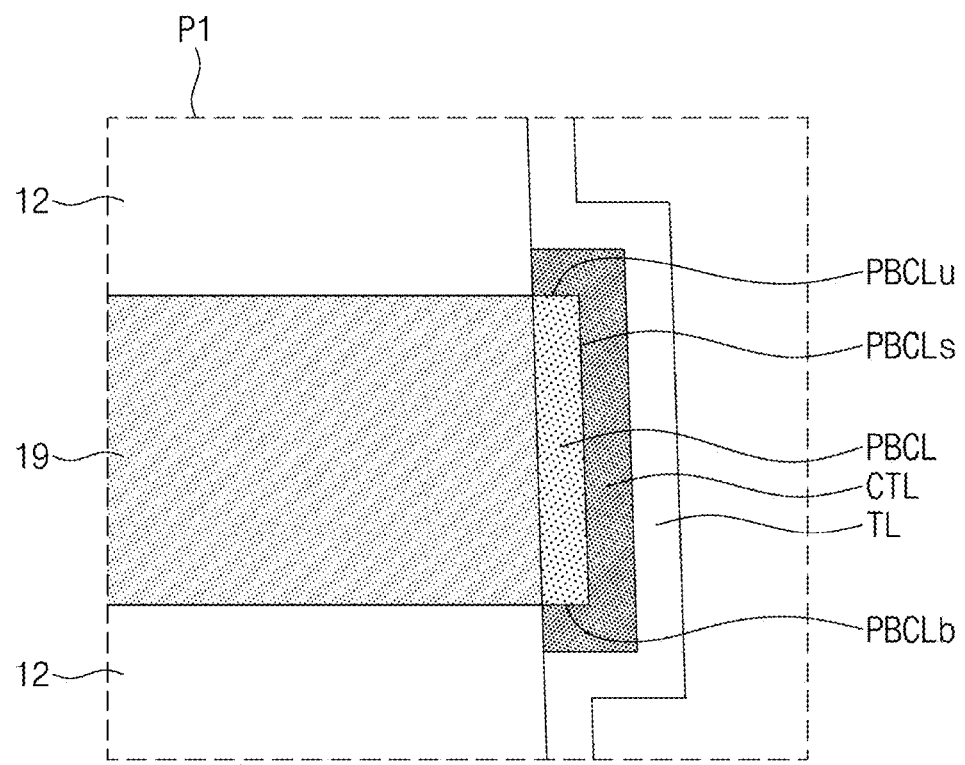
FIG. 9B illustrates an enlarged cross-sectional view showing section P1 of FIG. 9A.

Referring to FIGS. 9A and 9B, a first selective deposition process may be performed to form preliminary blocking patterns PBCL on corresponding sidewalls of the sacrificial layers 19 exposed to the first and second channel holes CH1 and CH2. When the sacrificial layers 19 are formed of a silicon nitride layer, the preliminary blocking patterns PBCL may be formed of a silicon layer or a polysilicon layer. A silane gas, such as monosilane ($SiH_4$) or disilane ($Si_2H_6$), may be supplied to perform the first selective deposition process. In the first selective deposition process, because an affinity between the silane gas and a silicon nitride layer that constitutes the sacrificial layers 19 is greater than an affinity between the silane gas and a silicon oxide layer that constitutes the intergate dielectric layers 12, the preliminary blocking patterns PBCL may be deposited only on surfaces of the sacrificial layers 19. Each of the preliminary blocking patterns PBCL may have a sidewall PBCLs, a top surface PBCLu, and a bottom surface PBCLb. When the lower sacrificial layer 13 is formed of a silicon oxide layer, a dummy preliminary blocking pattern DPBCL may also be formed on the sidewall of the lower sacrificial layer 13 during the formation of the preliminary blocking patterns PBCL. The dummy preliminary blocking pattern DPBCL may be formed of a silicon layer or a polysilicon layer.

A second selective deposition process may be performed to form charge storage patterns CTL on surfaces of corresponding preliminary blocking patterns PBCL. The charge storage patterns CTL may be formed of a silicon nitride layer. In the second selective deposition process, the preliminary blocking pattern PBCL and the dummy preliminary blocking pattern DPBCL may be provided only on their surfaces with one or more silicon source gases (e.g., silane, dichlorosilane, and tetrachlorosilane) to alternately and repeatedly perform a first step that forms a single-atom thick silicon layer and a second step that supplies a nitrogen source gas (e.g., ammonia) to combine the silicon layer with nitrogen to form a single-atom thick silicon nitride layer. When the second selective deposition process is performed, because an affinity between the silicon source gas and a silicon layer that constitutes the preliminary blocking patterns PBCL is greater than an affinity between the silicon source gas and a silicon oxide layer that constitutes the intergate dielectric layers 12, the charge storage patterns CTL may be formed only on the surfaces of the preliminary blocking patterns PBCL. Each of the charge storage patterns CTL may be formed to contact the sidewall PBCLs, the top surface PBCLu, and the bottom surface PBCLb of the preliminary blocking pattern PBCL. When the charge storage patterns CTL are formed, a dummy charge storage pattern DCTL may also be formed on the dummy preliminary blocking pattern DPBCL and a sidewall of the first source pattern SCP1 formed of a silicon layer. The dummy charge storage pattern DCTL may be formed of a silicon nitride layer.

An atomic layer deposition (ALD) process may be performed to conformally form a tunnel dielectric layer TL that conformally covers inner sidewalls and bottom surfaces of the first and second channel holes CH1 and CH2.

Figure 10A:
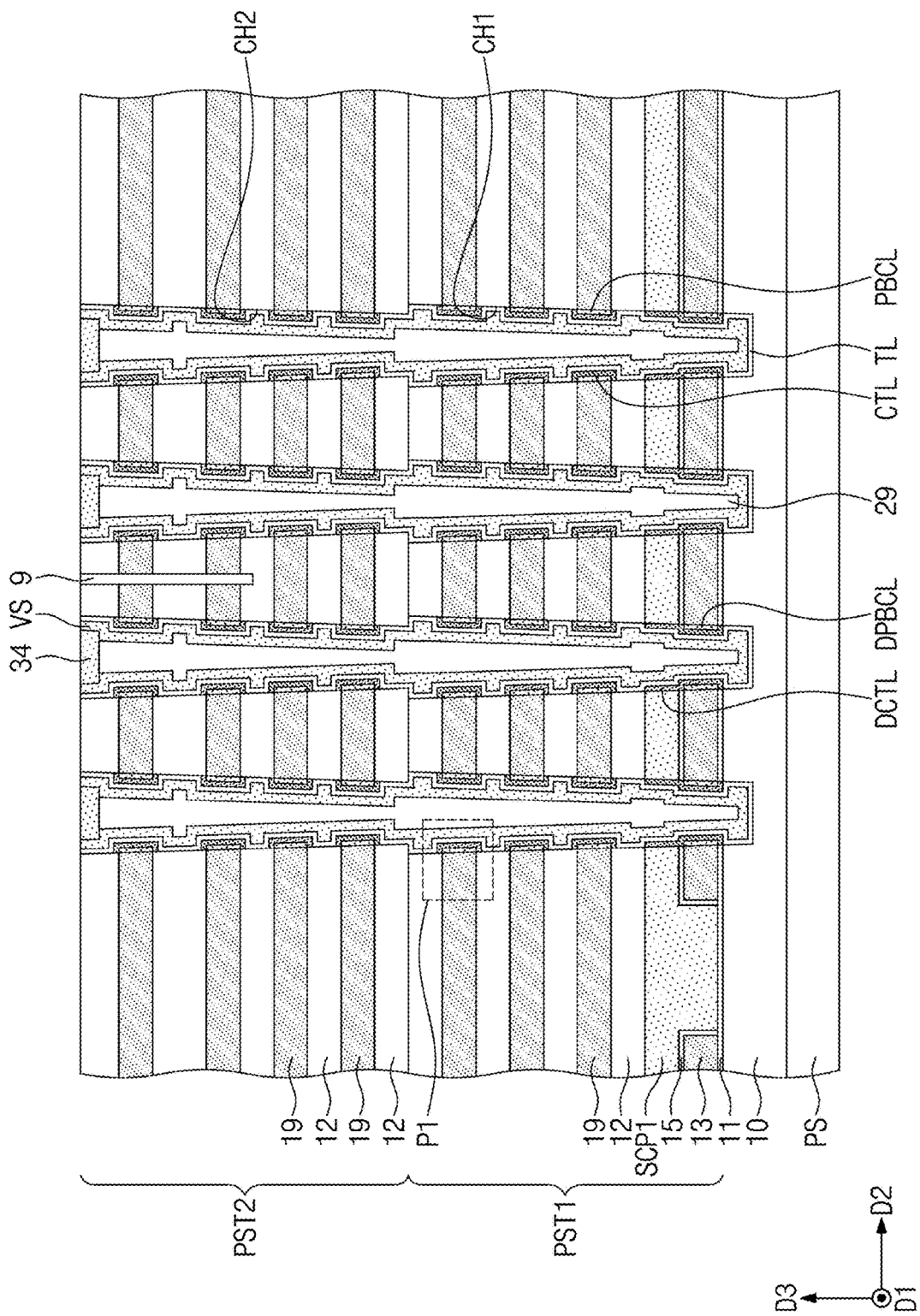
Figure 10B:
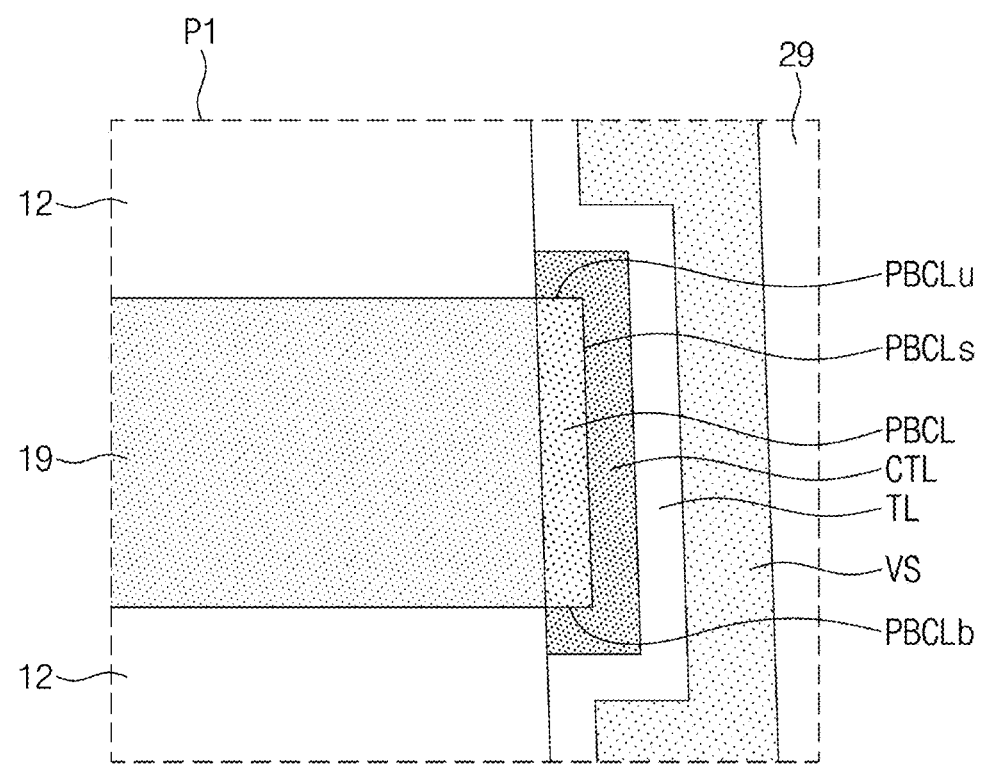
FIG. 10B illustrates an enlarged cross-sectional view showing section P1 of FIG. 10A.

Referring to FIGS. 10A and 10B, a semiconductor layer may be conformally deposited on the tunnel dielectric layer TL, a buried dielectric layer 5 may be formed to fill the first and second channel holes CH1 and CH2, and then a polishing process may be performed to form vertical semiconductor patterns VS in the first and second channel holes CH1 and CH2. An upper portion of the buried dielectric layer 5 may be recessed, and then the recess region may be filled with an impurity-doped semiconductor layer or a conductive layer to form a conductive pad 34. The aforementioned process may also form first and second dummy vertical semiconductor patterns DVS1 and DVS2 as shown in FIGS. 3 and 7.

Figure 11:
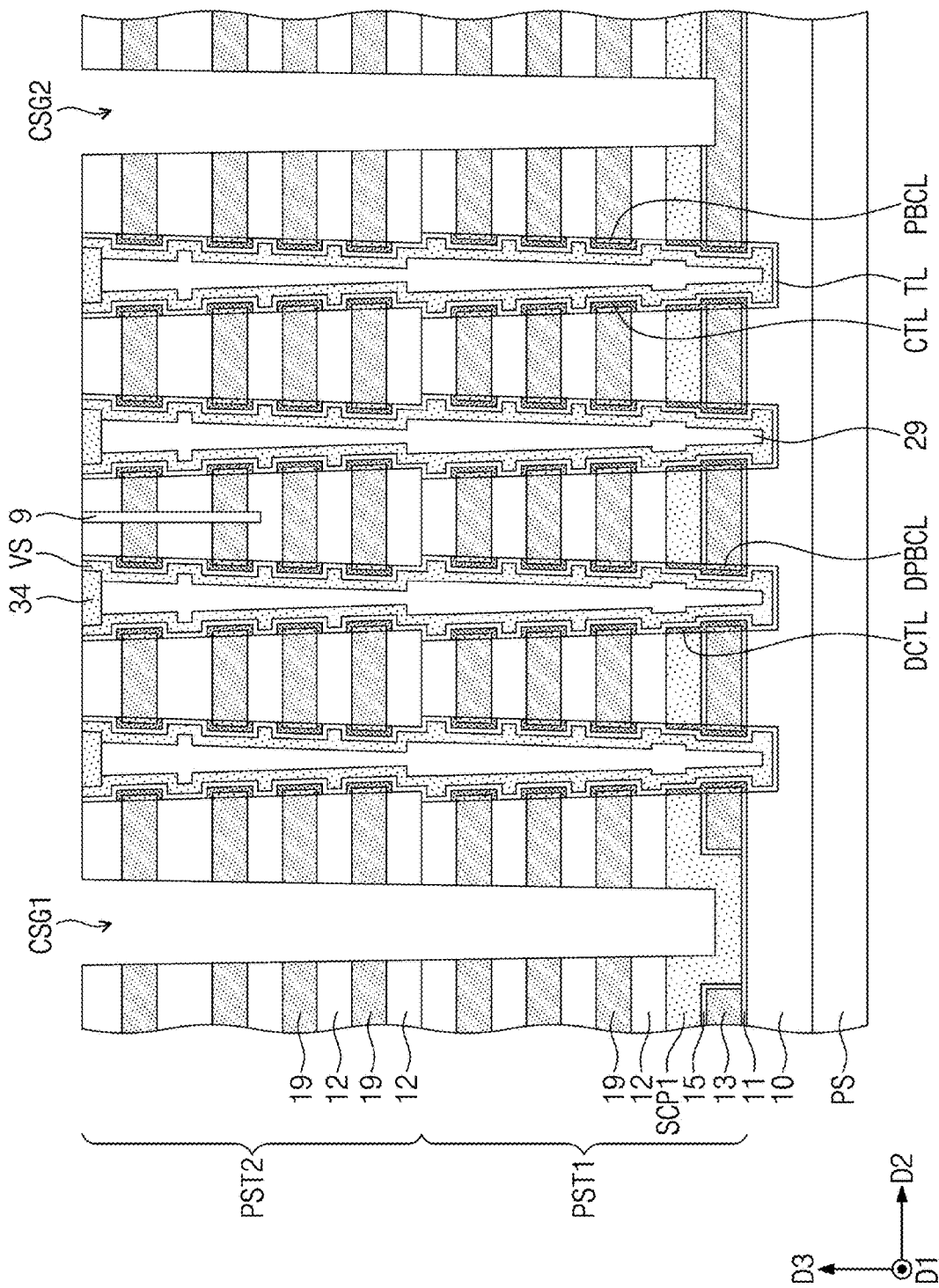

Referring to FIGS. 10A and 11, on a location spaced apart from the vertical semiconductor patterns VS, the second preliminary stack PST2 and the first preliminary stack PST1 may be successively etched to form first and second source contact grooves CSG1 and CSG2 that expose the second substrate 10. The second source contact groove CGS2 may expose sidewalls of the lower sacrificial layer 13, the auxiliary buffer dielectric layer 15, and the buffer dielectric layer 11.

Figure 12:
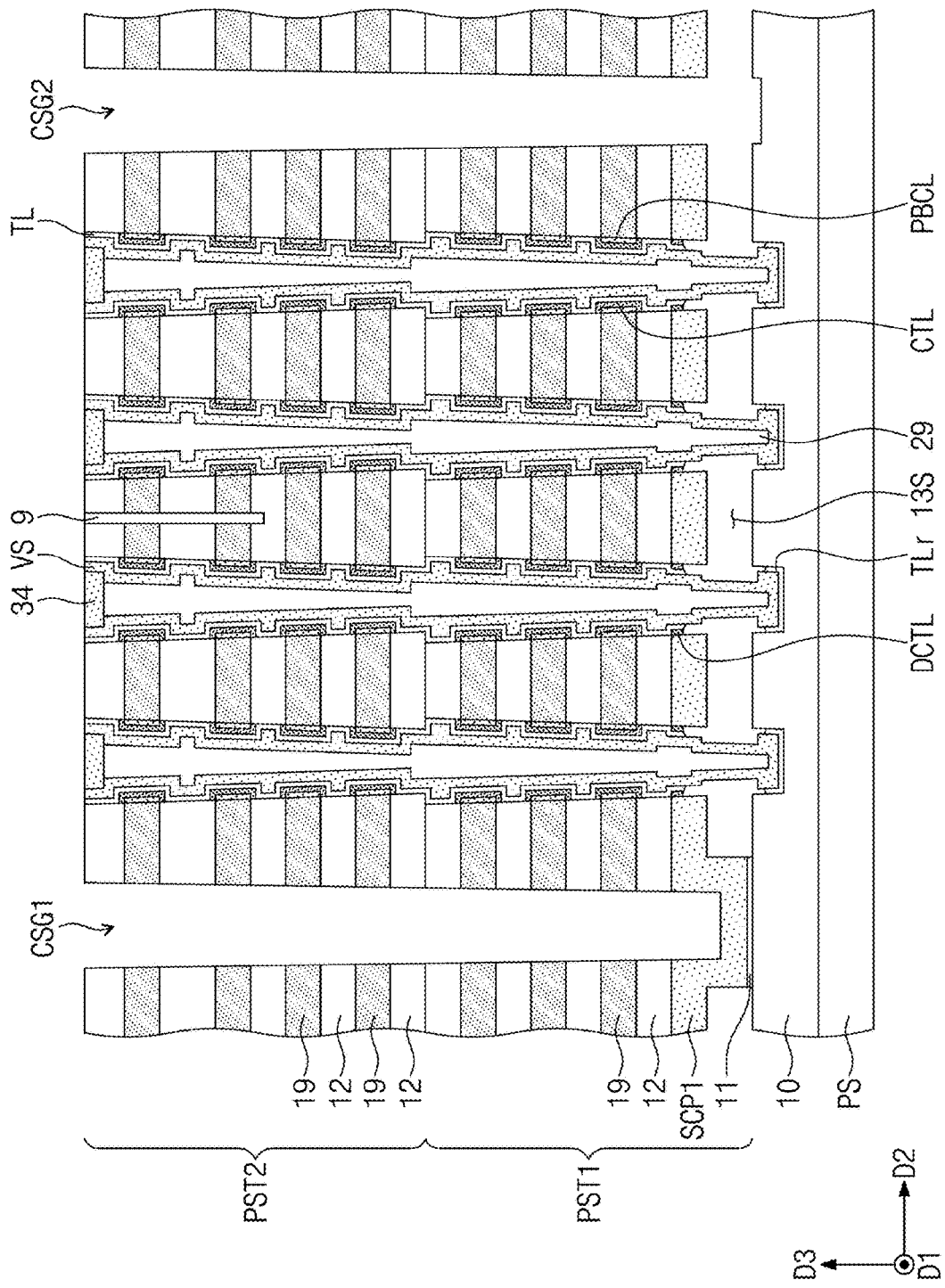

Referring to FIGS. 11 and 12, an isotropic etching process may be performed to remove the lower sacrificial layer 13, the auxiliary buffer dielectric layer 15, and the buffer dielectric layer 11 that are exposed to the second source contact groove CGS2, and thus a first empty space 13S may be formed which exposes a bottom surface and a lower sidewall of the first source pattern SCP1 and also exposes a top surface of the second substrate 10. At this stage, the dummy preliminary blocking pattern DPBCL, a portion of the dummy charge storage pattern DCTL, and a portion of the tunnel dielectric layer TL may be removed to expose a lower sidewall of the vertical semiconductor pattern VS and to leave a residual tunnel dielectric layer TLr on the bottom surface of the first channel hole CH1. In addition, a residual dummy charge storage pattern CTLr may remain between the tunnel dielectric layer TL and an upper portion of the first source pattern SCP1.

Figure 13:
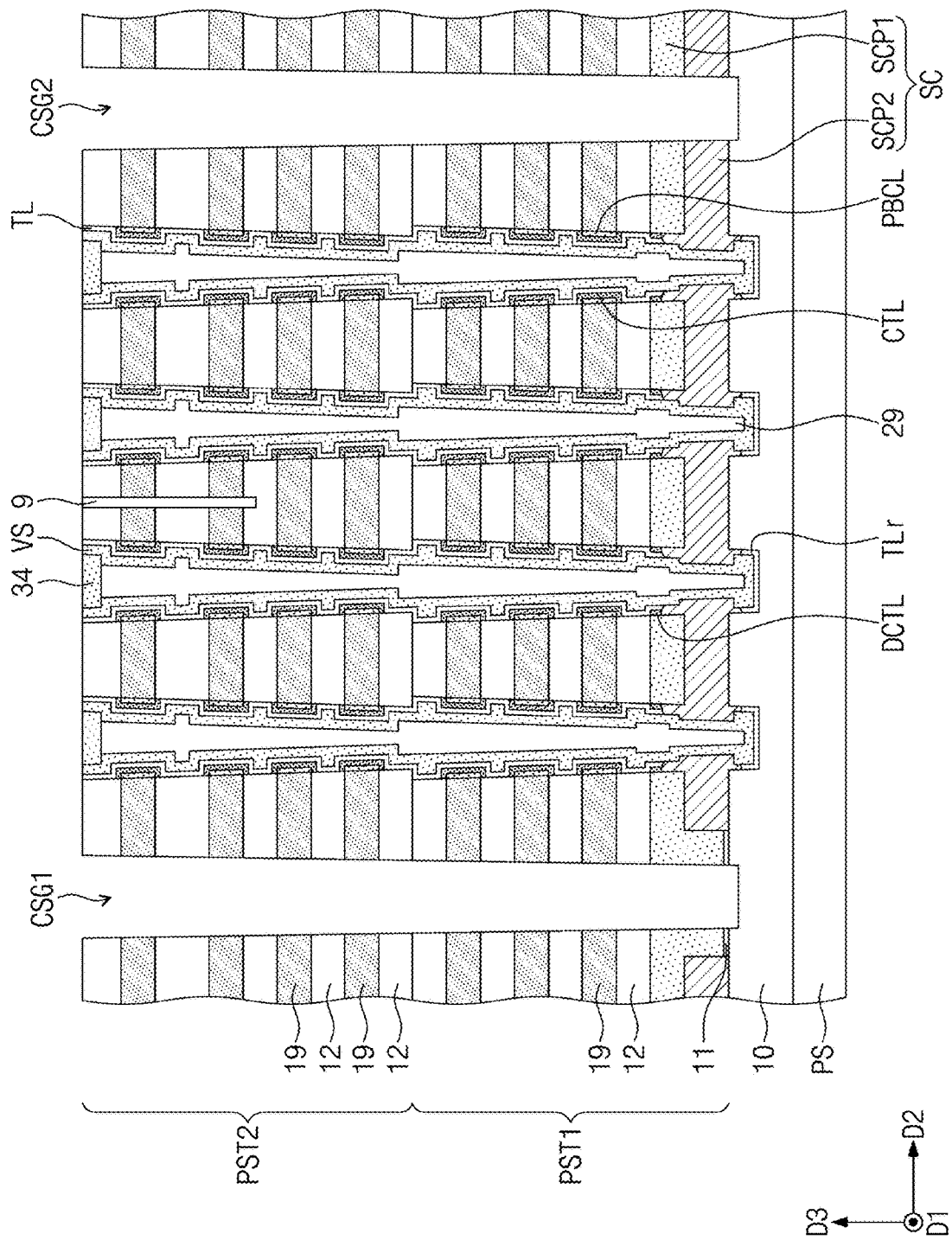

Referring to FIGS. 12 and 13, a conductive layer may be conformally stacked on the second preliminary stack PST2, thereby filling the first empty space 13S where the lower sacrificial layer 13 is removed through the second contact groove CSG2. The conductive layer may also be formed on sidewalls of the first and second source contact grooves CSG1 and CSG2. An etching process may be performed to remove the conductive layer from the sidewall of the first and second source contact grooves CSG1 and CSG2, and then the first empty space 13S may be filled with a second source pattern SCP2 formed of the conductive layer. The first and second source contact grooves CSG1 and CSG2 may be exposed at their sidewalls.

Figure 14A:
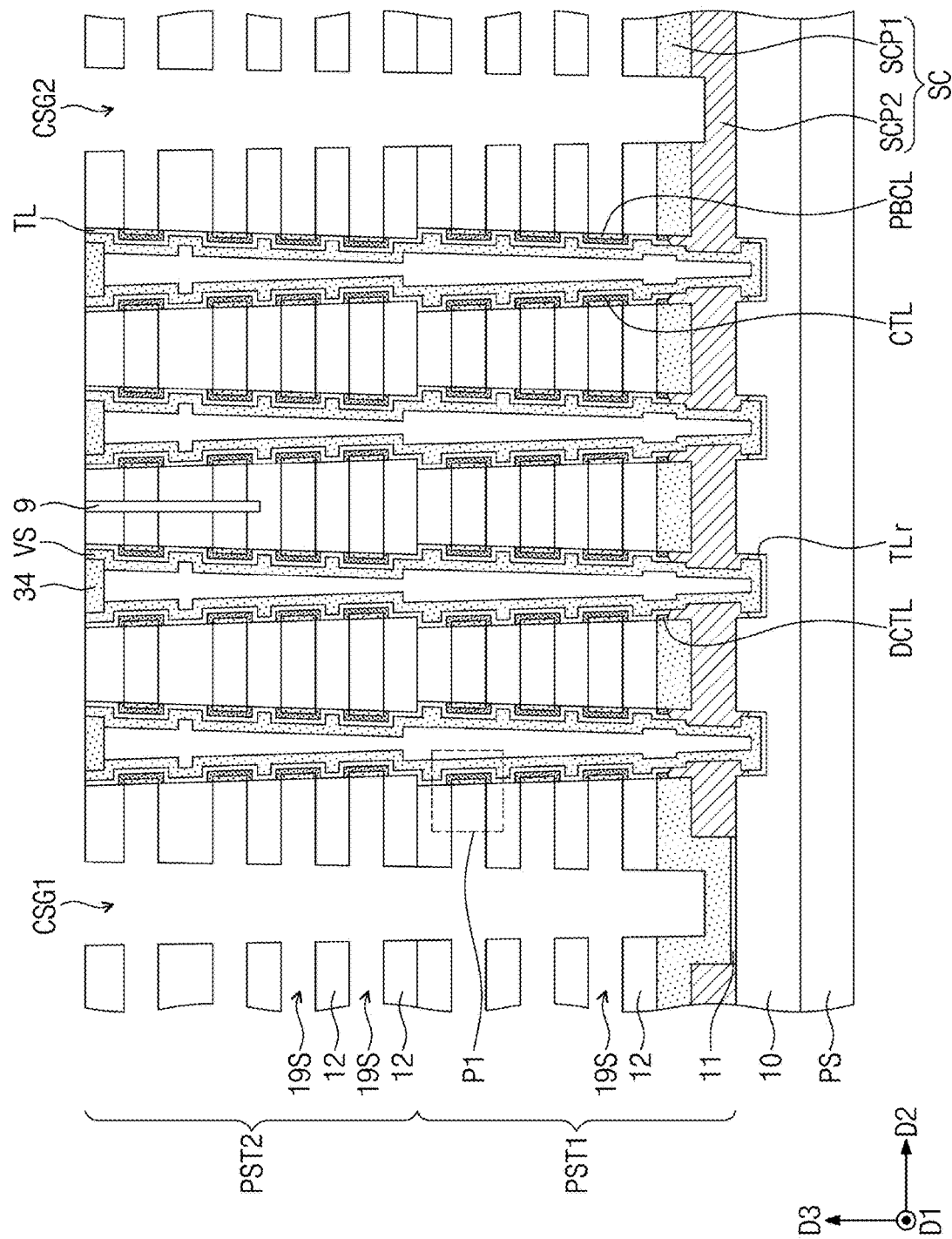
Figure 14B:
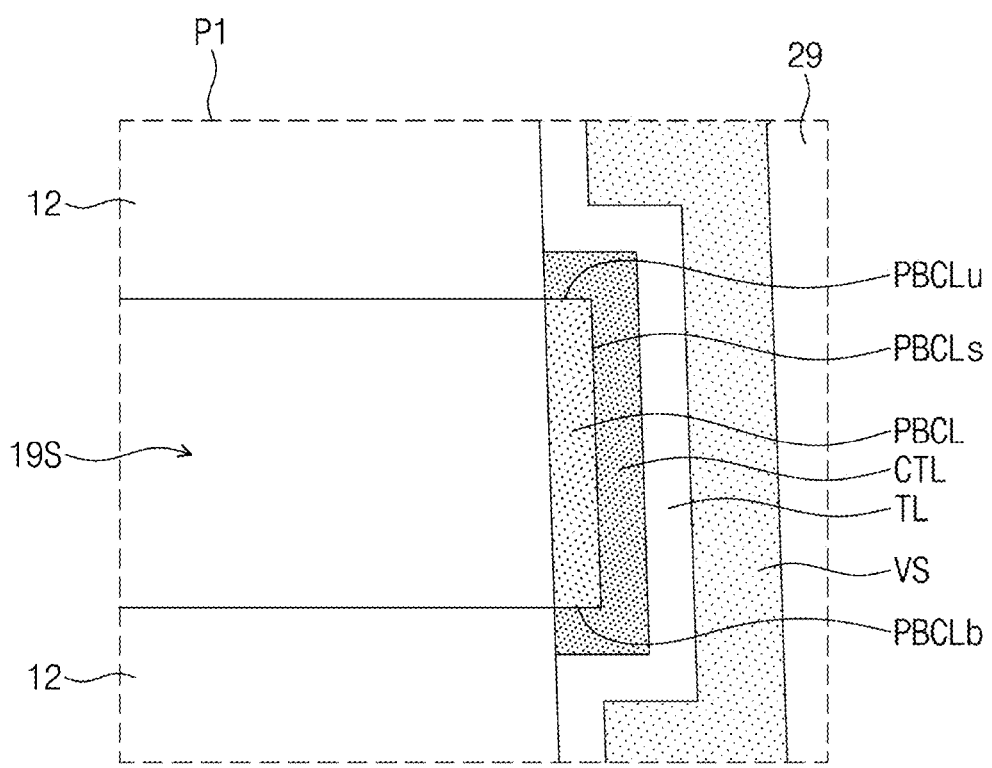
FIG. 14B illustrates an enlarged cross-sectional view showing section P1 of FIG. 14A.

Referring to FIGS. 13, 14A, and 14B, an isotropic etching process may be performed to remove the sacrificial layers 19 through the first and second source contact grooves CSG1 and CSG2, and second empty spaces 19S may be formed between the intergate dielectric layers 12. The second empty spaces 19S may expose the preliminary blocking patterns PBCL. In addition, the second empty spaces 19S may also expose a sidewall of the separation dielectric pattern 9.

Figure 15:
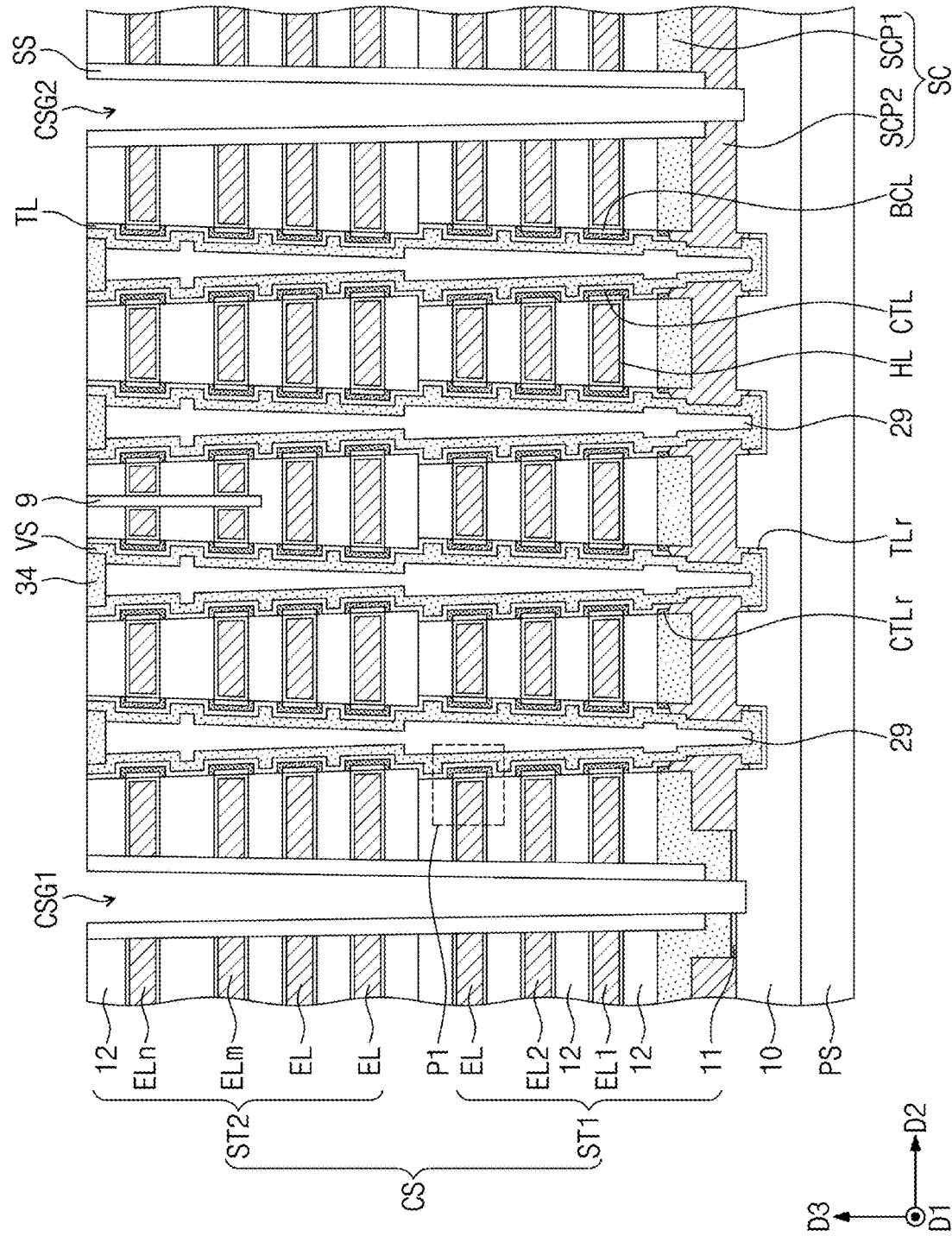

Referring to FIGS. 14A, 14B, and 15, an oxidation process may be performed to oxidize the preliminary blocking patterns PBCL exposed to the second empty spaces 19S, thereby forming blocking dielectric patterns BCL. Because the preliminary blocking patterns PBCL are formed of a silicon oxide layer, the blocking dielectric patterns BCL may be formed of the silicon oxide layer that is oxidized at the step discussed above. A high-k dielectric layer HL may be conformally formed to cover a sidewall of the blocking dielectric pattern BCL and top and bottom surfaces of the intergate dielectric layers 12, which sidewall and top and bottom surfaces are exposed to the second empty space 19S. A conductive layer may be formed to fill the second empty spaces 19S. The conductive layer may also be formed on the sidewalls of the first and second source contact grooves CSG1 and CSG2. The conductive layer may be removed from the sidewalls of the first and second source contact grooves CSG1 and CSG2, thereby exposing the sidewalls of the first and second source contact grooves CSG1 and CSG2. The second empty spaces 19S may be filled with electrode layers EL1, EL2, EL, ELm, and ELn formed of the conductive layer. A section P1 of FIG. 15 may be the same as that of FIG. 5. Dielectric spacers SS may be formed on the sidewalls of the first and second source contact grooves CSG1 and CSG2. Subsequently, referring to FIG. 4, first and second source contact plugs CSPLG1 and CSPLG2 may be respectively formed in the first and second source contact grooves CSG1 and CSG2.

Figure 16:
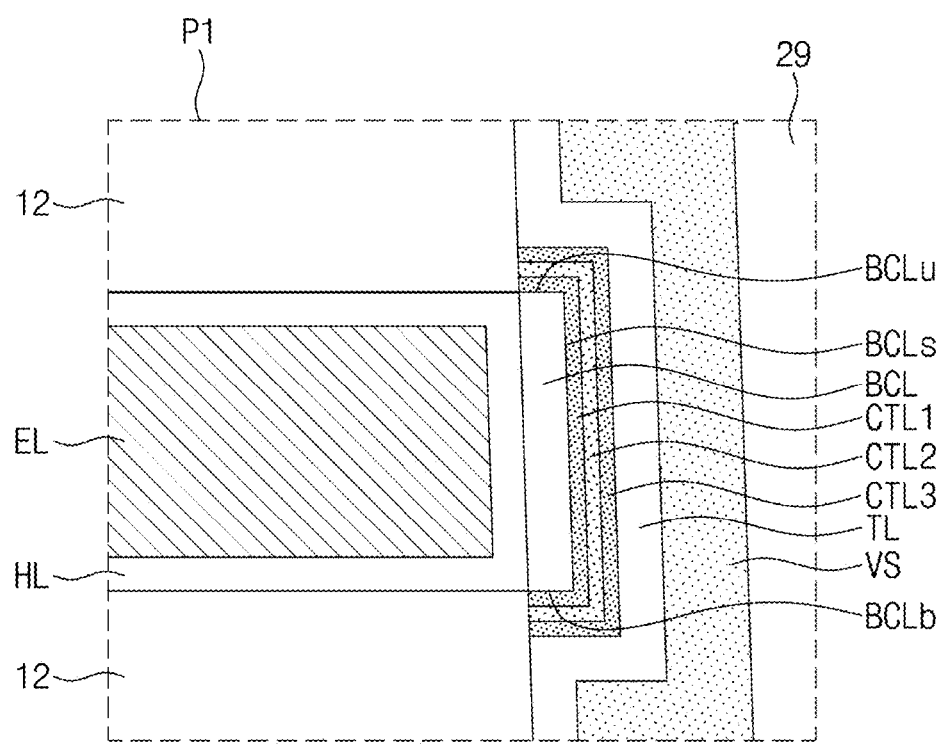
FIGS. 16, 17, and 18 illustrate enlarged cross-sectional views showing section P1 of FIG. 4.
Figure 18:
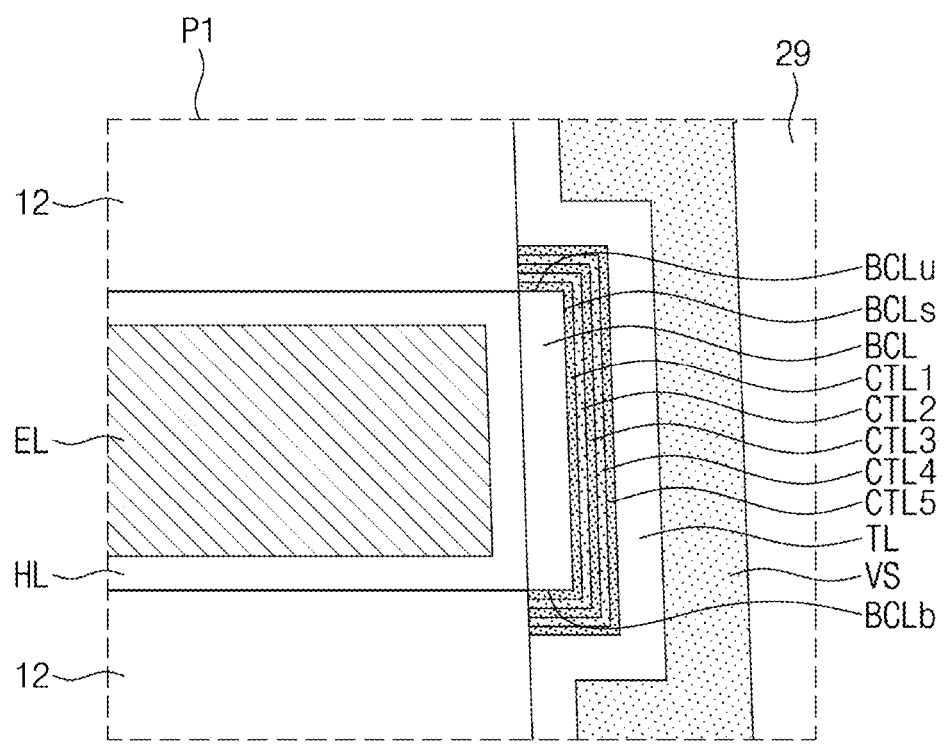

FIGS. 16 and 18 illustrate enlarged cross-sectional views showing section P1 of FIG. 4.

Referring to FIG. 16, in the present embodiment may, a triple layered charge storage pattern may be provided. For example, a first charge storage pattern CTL1 may be in contact with the sidewall BCLs, the top surface BCLu, and the bottom surface BCLb of the blocking dielectric pattern BCL. A second charge storage pattern CTL2 may cover a sidewall, a top surface, and a bottom surface of the first storage pattern CTL1. A third charge storage pattern CTL3 may cover a sidewall, a top surface, and a bottom surface of the second charge storage pattern CTL2. The second charge storage pattern CTL2 may include a different material from that of the first and third charge storage patterns CTL1 and CTL3. For example, the second charge storage pattern CTL2 may include a silicon layer or a polysilicon layer. The first and third charge storage patterns CTL1 and CTL3 may include a silicon nitride layer.

Figure 17:
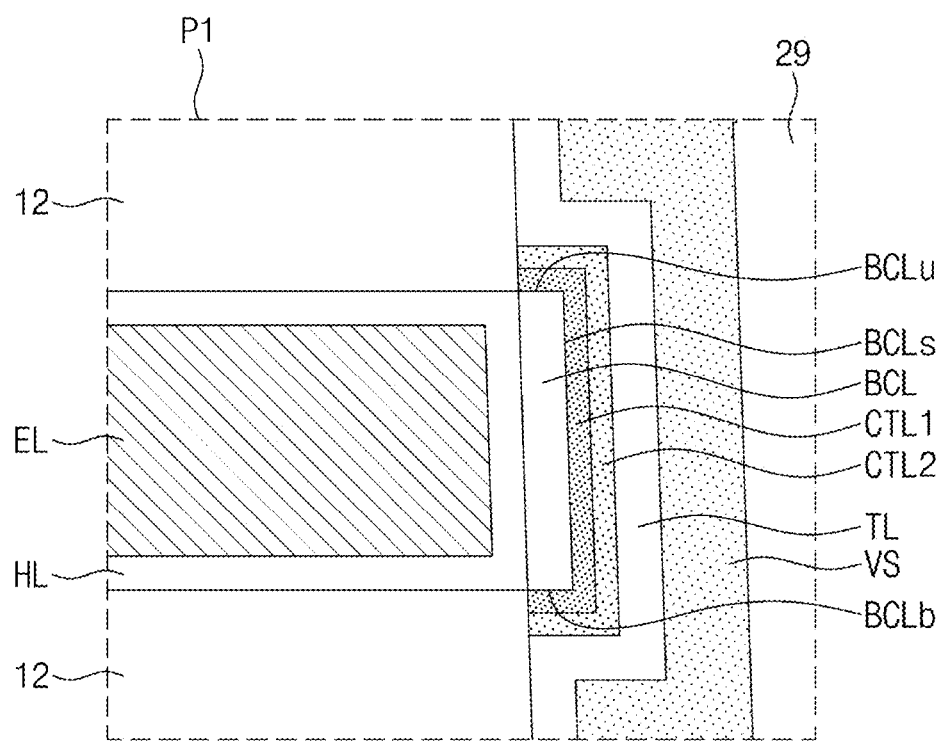

Alternatively, referring to FIG. 17, a double layered charge storage pattern may be provided. For example, a first charge storage pattern CTL1 may be in contact with the sidewall BCLs, the top surface BCLu, and the bottom surface BCLb of the blocking dielectric pattern BCL. A second charge storage pattern CTL2 may cover a sidewall, a top surface, and a bottom surface of the first storage pattern CTL1. The second charge storage pattern CTL2 may include a silicon layer or a polysilicon layer. The first charge storage pattern CTL1 may include a silicon nitride layer.

Referring to FIG. 18, in the present embodiment may, a quintuple layered charge storage pattern may be provided. For example, first to fifth charge storage patterns CTL1 to CTL5 may be interposed between the blocking dielectric pattern BCL and the tunnel dielectric layer TL. The second and fourth charge storage patterns CTL2 and CTL4 may include a material different from that of the first, third, and fifth charge storage patterns CTL1, CTL3, and CTL5. For example, the second and fourth charge storage patterns CTL2 and CTL4 may include a silicon layer or a polysilicon layer, and the first, third, and fifth charge storage patterns CTL1, CTL3, and CTL5 may include a silicon nitride layer.

Semiconductor memory devices of FIGS. 16 to 18 may be advantageous to conduct the operation of multi-level cell (MLC).

The semiconductor memory devices of FIGS. 16 to 18 may be formed by alternately and repeatedly performing the first selective deposition process and the second selective deposition process at the step of FIGS. 9A and 9B.

Figure 19:
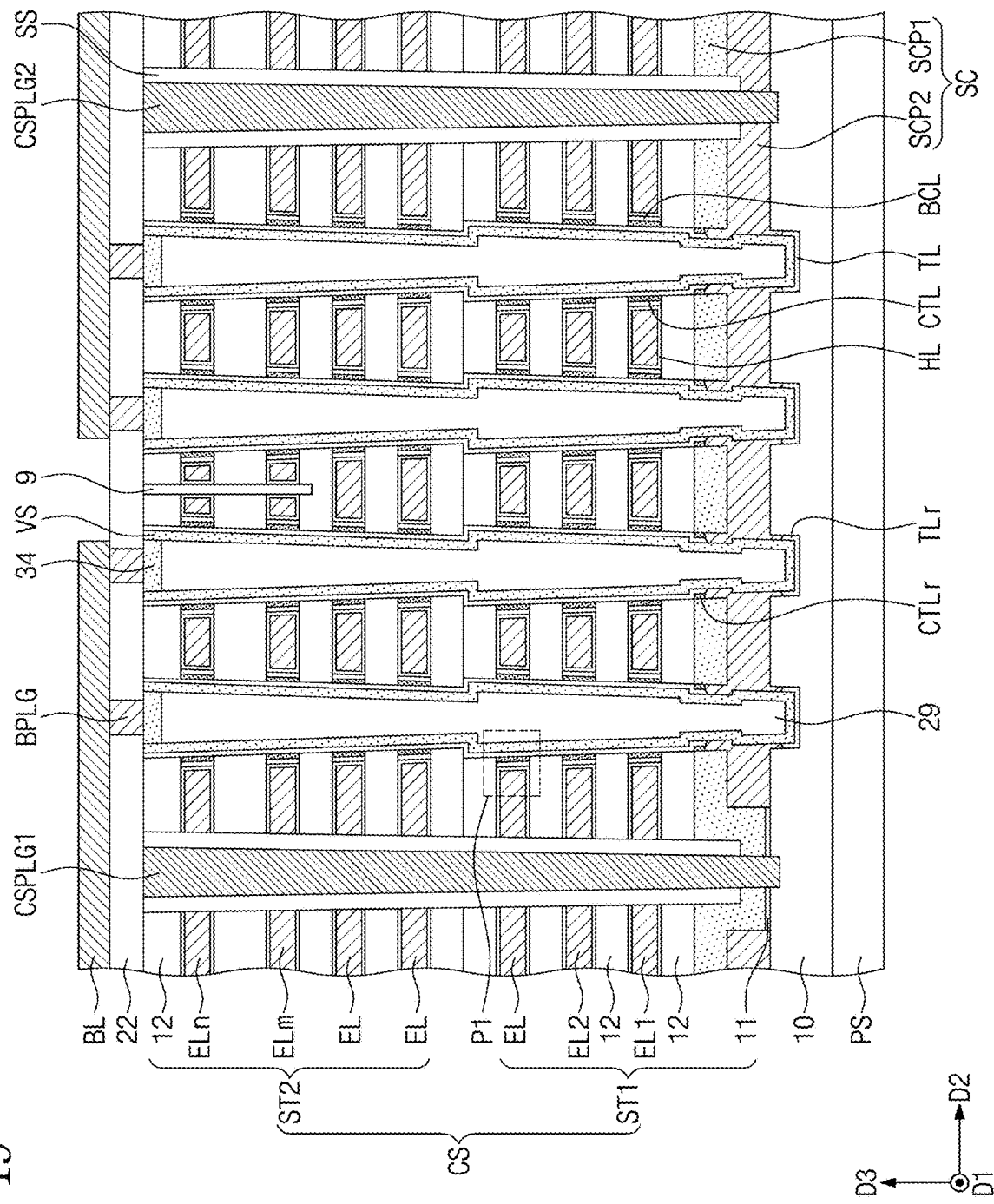
FIG. 19 illustrates a cross-sectional view taken along line A-A' of FIG. 3.
Figure 20A:
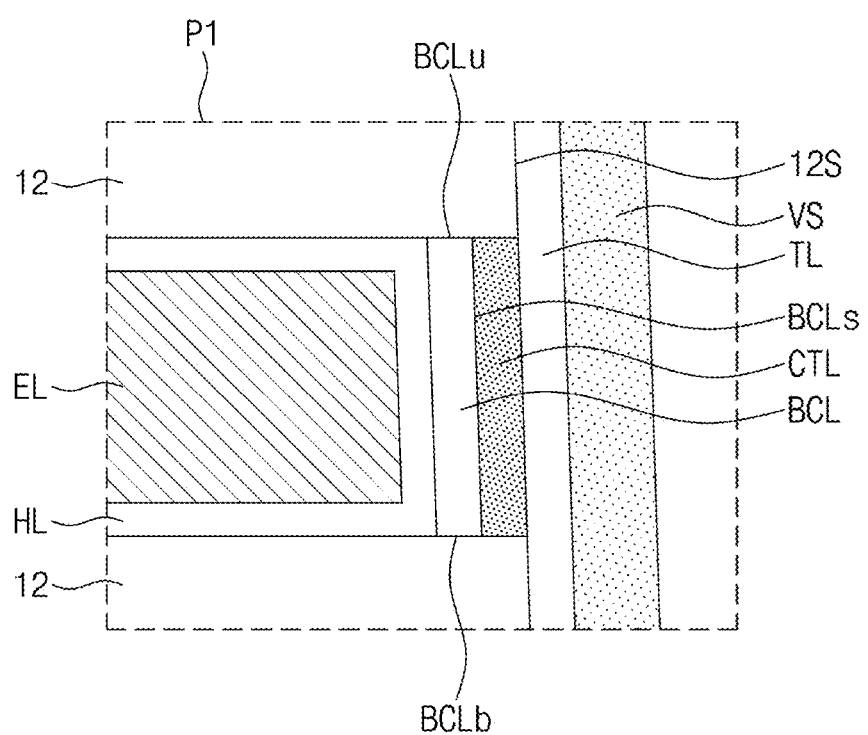
FIG. 20A illustrates an enlarged cross-sectional view showing section P1 of FIG. 19.

FIG. 19 illustrates a cross-sectional view taken along line A-A' of FIG. 3. FIG. 20A illustrates an enlarged view showing section P1 of FIG. 19.

Referring to FIGS. 19 and 20A, the charge storage pattern CTL may have a sidewall aligned with the sidewall 12s of the intergate dielectric layer 12. The charge storage pattern CTL may have a vertical length the same as that of the blocking dielectric pattern BCL. The intergate dielectric layer 12 between adjacent ones of the electrode layers EL1, EL2, EL, ELm, and ELn may protrude toward the vertical semiconductor pattern VS, compared to the blocking dielectric pattern BCL and the high-k dielectric layer HL that are adjacent to the intergate dielectric layer 12. Therefore, during operation of the semiconductor memory device of FIGS. 19 and 20A, the intergate dielectric layer 12 may serve as an electric field barrier to block or alleviate a fringe field effect caused by voltage applied to the electrode layers EL1, EL2, EL, ELm, and ELn adjacent to the intergate dielectric layer 12. Accordingly, it may be possible to reduce or prevent malfunctions and to increase reliability of the semiconductor memory device. The tunnel dielectric layer TL and the vertical semiconductor pattern VS may have their cross-sectional views whose unevenness is less than that of FIG. 4. The charge storage pattern CTL may be in contact with the sidewall BCLs of the blocking dielectric pattern BCL, but with neither the top surface BCLu nor the bottom surface BCLb of the blocking dielectric pattern BCL. Other configurations may be identical or similar to those discussed with reference to FIGS. 3 to 7.

Figure 20B:
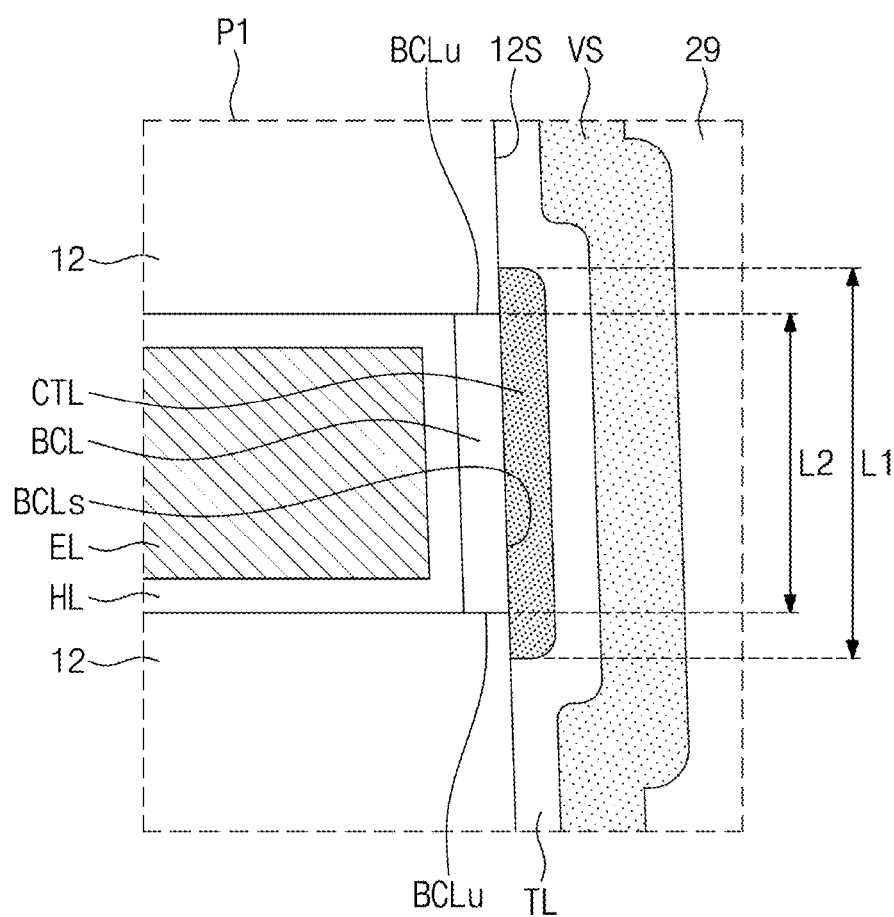
FIG. 20B illustrates an enlarged cross-sectional view showing section P1 of FIG. 19.

FIG. 20B illustrates an enlarged cross-sectional view showing section P1 of FIG. 19.

Referring to FIG. 20B, the blocking dielectric pattern BCL may have a sidewall aligned with the sidewall 12s of the intergate dielectric layer 12. The charge storage pattern CTL may be in contact with the sidewall BCLs of the blocking dielectric pattern BCL and simultaneously with a portion of the sidewall 12s of the intergate dielectric layer 12. The charge storage pattern CTL may be in contact with the sidewall BCLs of the blocking dielectric pattern BCL, but with neither the top surface BCLu nor the bottom surface BCLb of the blocking dielectric pattern BCL. The charge storage pattern CTL may have a vertical length L1 greater than a vertical length L2 of the blocking dielectric pattern BCL. Other configurations may be identical or similar to those discussed with reference to FIG. 20A.

Figure 21:
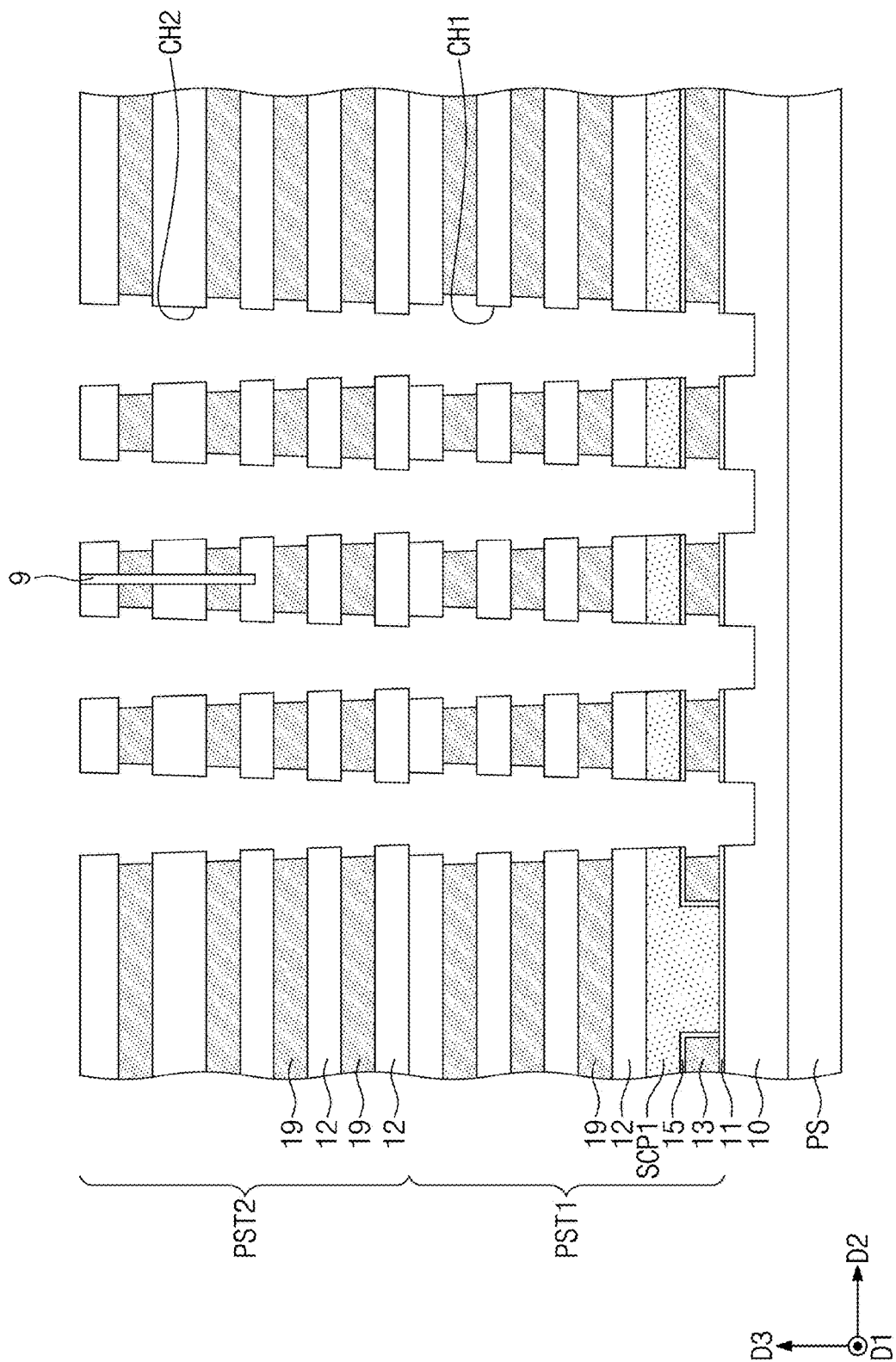
FIGS. 21 and 22 illustrate cross-sectional views showing a method of fabricating the three-dimensional semiconductor memory device of FIG. 20A.
Figure 22:
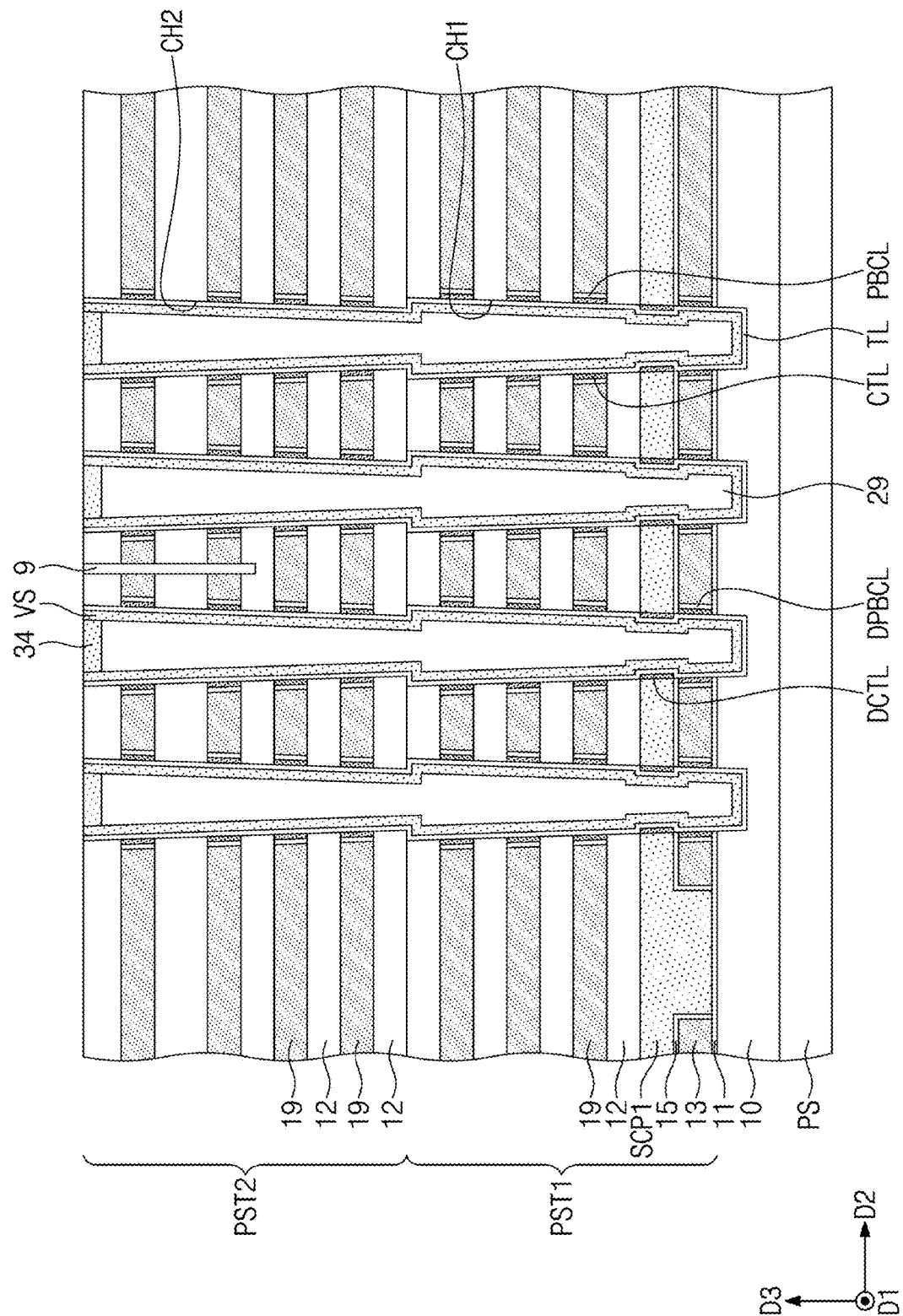

FIGS. 21 and 22 illustrate cross-sectional views showing a method of fabricating the three-dimensional semiconductor memory device of FIG. 20A.

Referring to FIG. 21, the buried dielectric layer 5 may be removed from the first preliminary stack ST1 of FIG. 8 to thereby expose the sidewalls of the first and second channel holes CH1 and CH2. For example, an isotropic etching process may be performed to partially remove the sacrificial layers 19 and the lower sacrificial layer 13 to partially expose top and bottom surfaces of the sacrificial layers 19 adjacent to the first and second channel holes CH1 and CH2. In addition, a top surface of the buffer dielectric layer 11 may be exposed, and a bottom surface of the auxiliary buffer dielectric layer 15 may be exposed.

Referring to FIGS. 21 and 22, the first selective deposition process discussed with reference to FIGS. 9A and 9B may be performed to form the preliminary blocking patterns PBCL on the sidewalls of the sacrificial layers 19 and of the lower sacrificial layer 13. At this stage, the preliminary blocking patterns PBCL may be formed to have their thicknesses that do not protrude beyond the sidewalls of the sacrificial layers 19. In addition, the second selective deposition process may be performed to form the charge storage patterns CTL. The charge storage patterns CTL may be formed to have their thicknesses that do not protrude beyond the sidewalls of the sacrificial layers 19. Subsequently, the processes discussed with reference to FIGS. 9A to 15 may be performed to fabricate the semiconductor memory device of FIG. 19.

Figure 23:
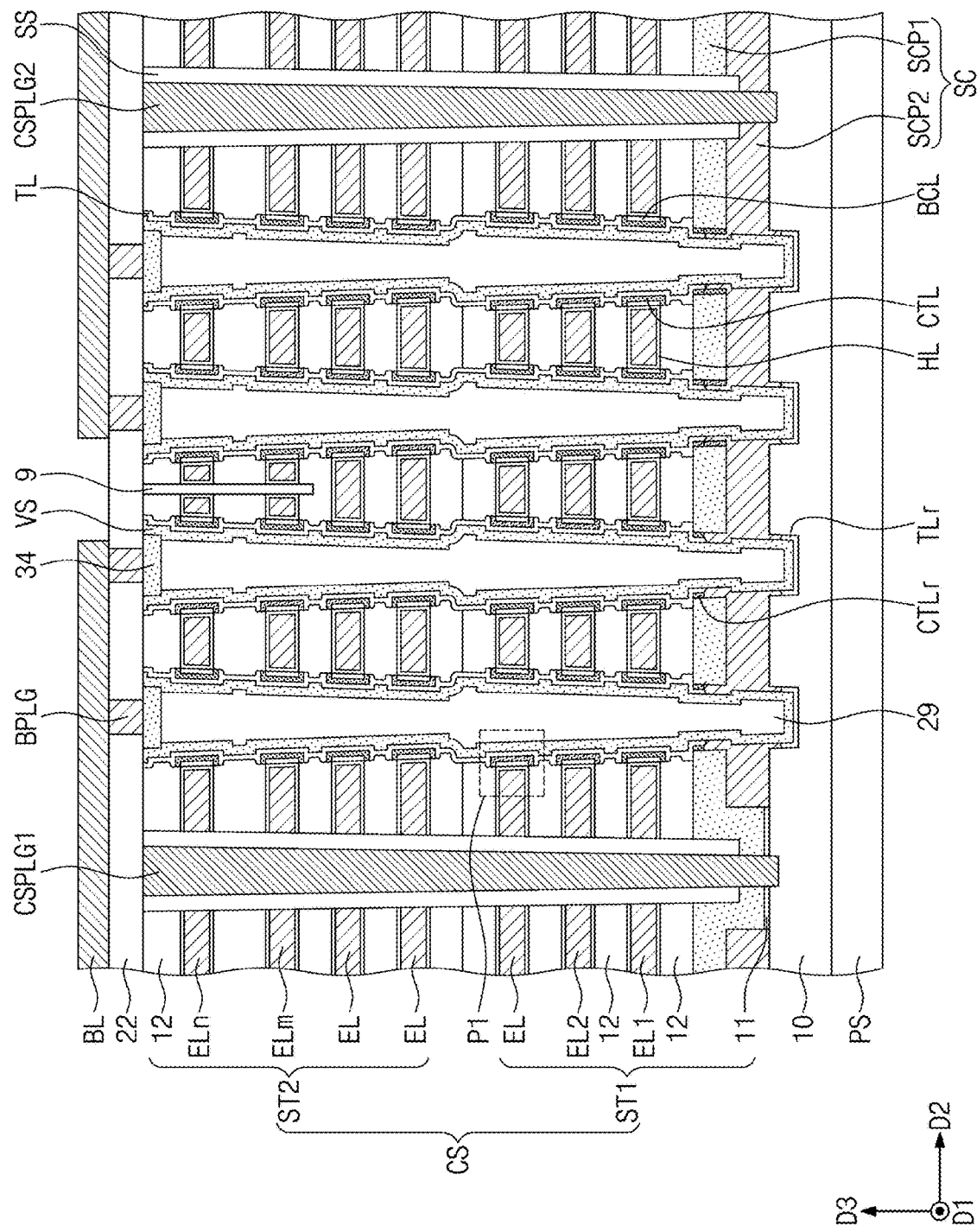
FIG. 23 illustrates a cross-sectional view taken along line A-A' of FIG. 3.
Figure 24:
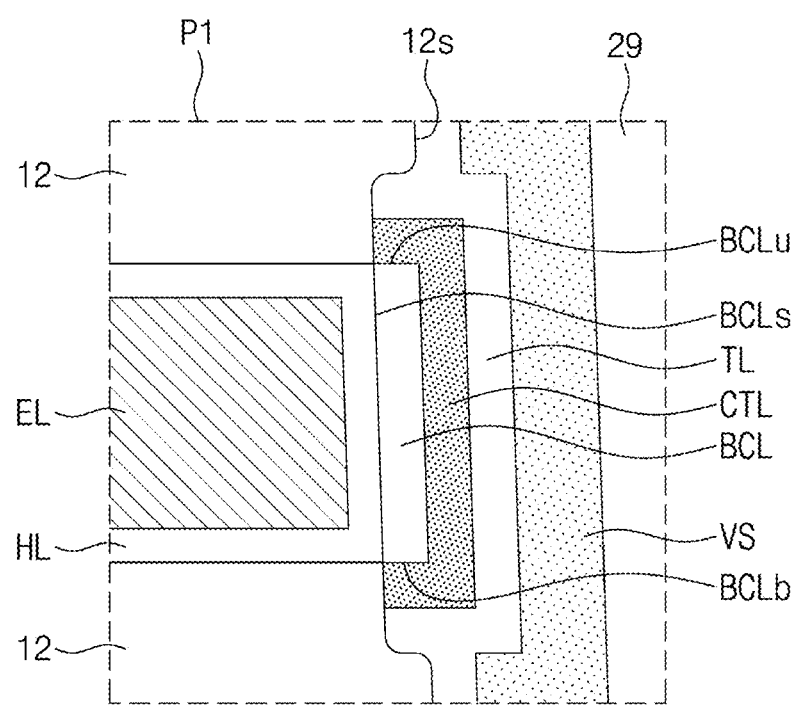
FIG. 24 illustrates an enlarged cross-sectional view showing section P1 of FIG. 23.

FIG. 23 illustrates a cross-sectional view taken along line A-A' of FIG. 3. FIG. 24 illustrates an enlarged view showing section P1 of FIG. 23.

Referring to FIGS. 23 and 24, the sidewall 12s of the intergate dielectric layer 12 may laterally protrude, compared to the high-k dielectric layer HL, but not compared to the charge storage pattern CTL. The sidewall 12s of the intergate dielectric layer 12 may have an uneven structure. A middle portion of the sidewall 12s of the intergate dielectric layer 12 may protrude more than top and bottom portions of the sidewall 12s of the intergate dielectric layer 12. The charge storage pattern CTL may be in contact with the sidewall BCLs, the top surface BCLu, and the bottom surface BCLb of the blocking dielectric pattern BCL, and may have a C-shaped cross-section. During operation of the semiconductor memory device of FIGS. 23 and 24, the intergate dielectric layer 12 may serve to block or alleviate a fringe field effect caused by voltage applied to the electrode layers EL1, EL2, EL, ELm, and ELn adjacent to the intergate dielectric layer 12. Accordingly, it may be possible to reduce or prevent malfunctions and to increase reliability of the semiconductor memory device. Other configurations may be identical or similar to those discussed above with reference to FIG. 19.

Figure 25:
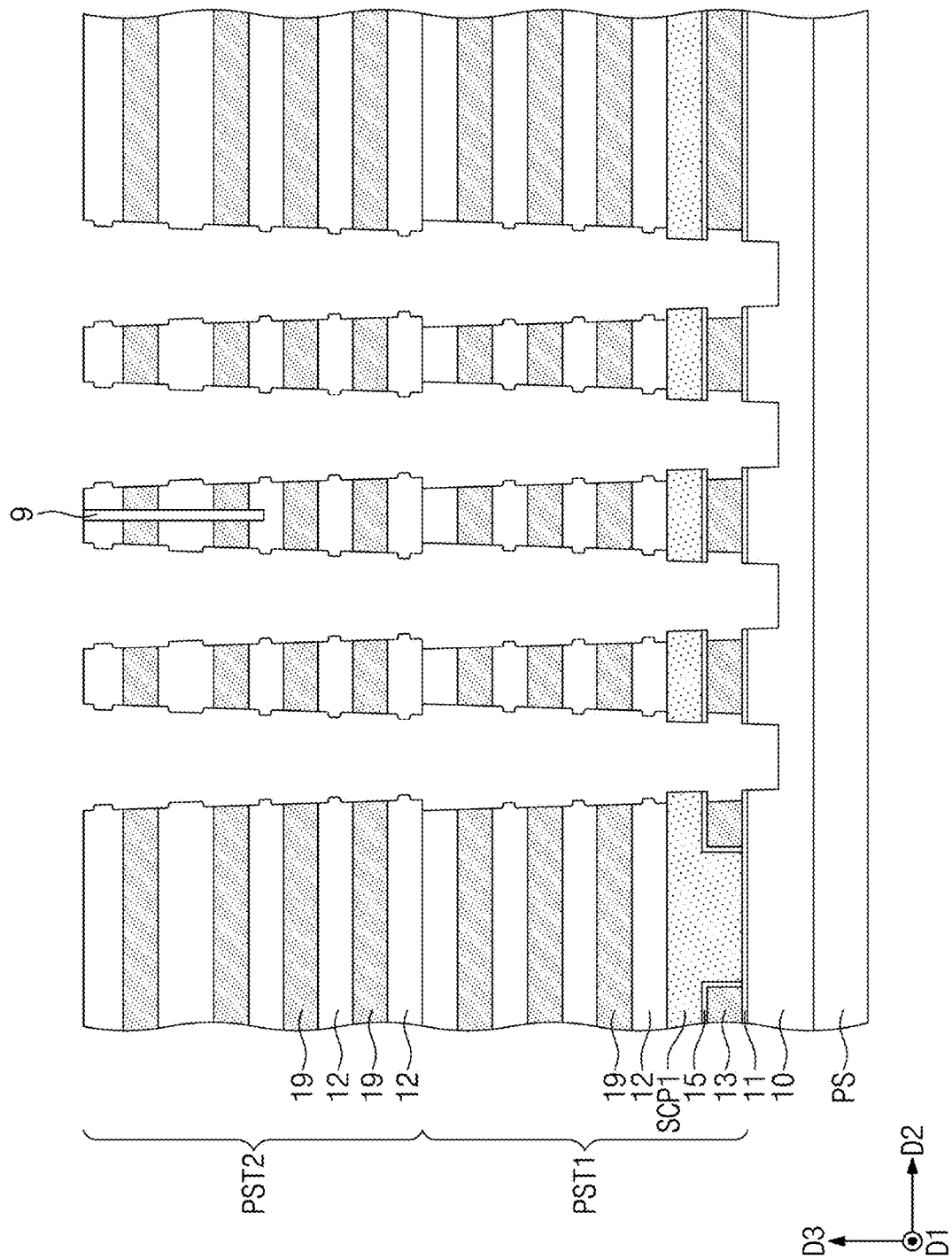
FIGS. 25 and 26 illustrate cross-sectional views showing a method of fabricating the three-dimensional semiconductor memory device of FIG. 23.
Figure 26:
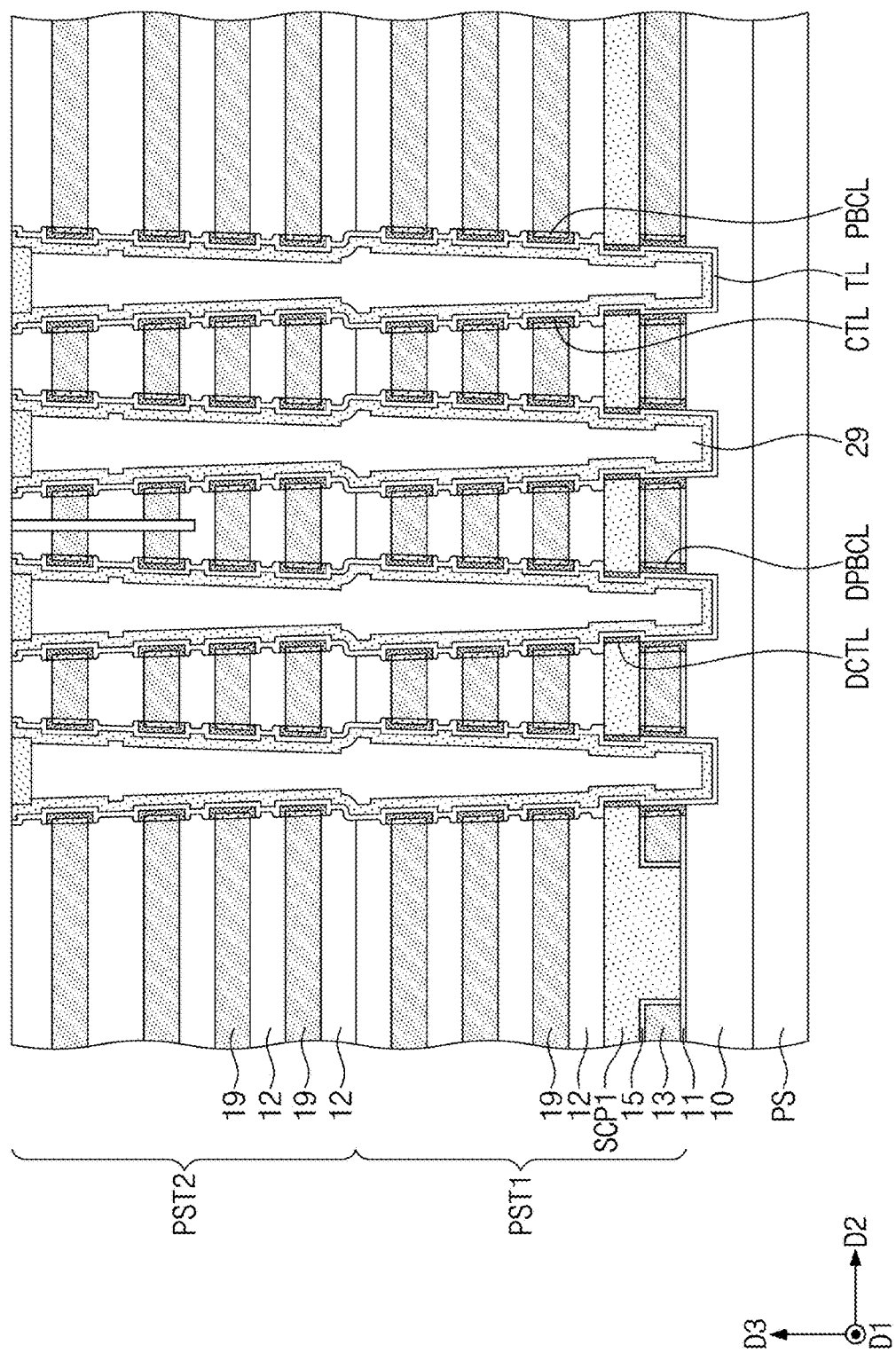

FIGS. 25 and 26 illustrate cross-sectional views showing a method of fabricating the three-dimensional semiconductor memory device of FIG. 23.

Referring to FIGS. 24 and 25, the intergate dielectric layers 12 that protrude shown in FIG. 21 may experience an isotropic etching process at high temperature using an etchant that includes one or more of hydrofluoric acid and phosphoric acid to partially remove protruding portions of the intergate dielectric layers 12 and simultaneously to cause the sidewalls 12s of the intergate dielectric layers 12 to have uneven or rounded profiles.

Referring to FIGS. 24 and 26, the first selective deposition process discussed with reference to FIGS. 9A and 9B may be performed to form the blocking dielectric patterns BCL. And then, the second selective deposition process may be performed to form the charge storage patterns CTL. Subsequent processes may be performed as discussed with reference to FIGS. 9A to 15.

Figure 27:
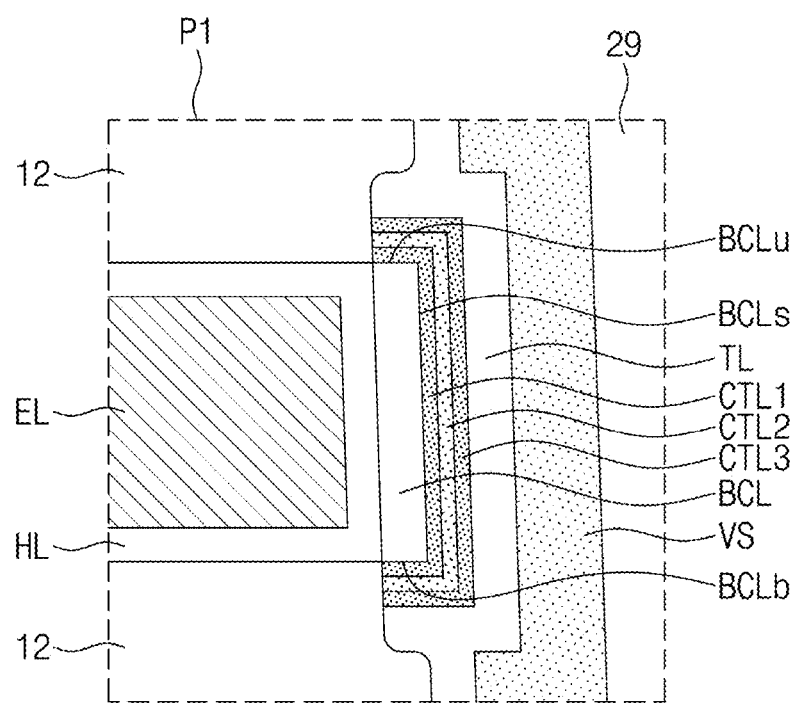
FIG. 27 illustrates an enlarged cross-sectional view showing section P1 of FIG. 23.

FIG. 27 illustrates an enlarged cross-sectional view showing section P1 of FIG. 23. The embodiment of FIG. 27 may correspond to that where the example of FIG. 24 is combined with the example of FIG. 16.

Referring to FIG. 27, the first charge storage pattern CTL1 may be in contact with the sidewall BCLs, the top surface BCLu, and the bottom surface BCLb of the blocking dielectric pattern BCL. The second charge storage pattern CTL2 may cover the sidewall, the top surface, and the bottom surface of the first storage pattern CTL1. The third charge storage pattern CTL3 may cover the sidewall, the top surface, and the bottom surface of the second charge storage pattern CTL2. The second charge storage pattern CTL2 may include a different material from that of the first and third charge storage patterns CTL1 and CTL3. For example, the second charge storage pattern CTL2 may include a silicon layer or a polysilicon layer. The first and third charge storage patterns CTL1 and CTL3 may include a silicon nitride layer. The middle portion of the sidewall 12s of the intergate dielectric layer 12 may protrude more than the top and bottom portions of the sidewall 12s of the intergate dielectric layer 12.

In a three-dimensional semiconductor memory device according to the present inventive concepts, because charge storage patterns are spaced apart from each other without being connected to each other, when the three-dimensional semiconductor memory device is operated, charges stored in the charge storage patterns may be prevented from moving to neighboring charge storage patterns, with the result that data loss may be avoided. As a result, the three-dimensional semiconductor memory device may increase in reliability.

Moreover, in the three-dimensional semiconductor memory device according to the present inventive concepts, because the charge storage patterns have C-shaped cross-sections or vertical lengths greater than those of blocking dielectric patterns, charge storage areas may increase to facilitate the operation of the multi-level cell (MLC).

Further, in the three-dimensional semiconductor memory device according to the present inventive concepts, an intergate dielectric layer between adjacent electrode layers may protrude toward a vertical semiconductor pattern, compared to the blocking dielectric pattern or the high-k dielectric layer adjacent to the intergate dielectric layer. Therefore, the intergate dielectric layer may serve as an electric field barrier to reduce or block a fringe field effect caused by voltage applied to an adjacent electrode layer, and as a result, it may be possible to reduce or prevent malfunctions and to increase reliability of the semiconductor memory device.

Although the present invention has been described in connection with some example embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the inventive concepts.

What is claimed is:
1. A three-dimensional semiconductor memory device, comprising:
   a plurality of intergate dielectric layers and a plurality of electrode layers alternately stacked on a substrate;
   a vertical semiconductor pattern that penetrates the intergate dielectric layers and the electrode layers, the vertical semiconductor pattern extending into the substrate;
   a plurality of blocking dielectric patterns between the vertical semiconductor pattern and the electrode layers, respectively, the plurality of blocking dielectric patterns spaced apart from each other;
   a tunnel dielectric layer between the plurality of blocking dielectric patterns and the vertical semiconductor pattern, the tunnel dielectric layer over the plurality of blocking dielectric patterns and simultaneously a portion of a vertical surface of the tunnel dielectric layer is in direct contact with the intergate dielectric layers; and
   a plurality of first charge storage patterns between the plurality of blocking dielectric patterns and the tunnel dielectric layer, respectively, the first charge storage patterns spaced apart from each other,
   wherein one of the first charge storage patterns is in contact with a top surface and a bottom surface of one of the plurality of blocking dielectric patterns.

2. The device of claim 1, wherein each of the first charge storage patterns has a C-shaped cross-section.

3. The device of claim 1, wherein the one of the first charge storage patterns is in contact with a sidewall of the intergate dielectric layers adjacent to the one of the plurality of blocking dielectric patterns.

4. The device of claim 1, wherein a vertical length of the one of the first charge storage patterns is greater than a vertical length of the one of the plurality of blocking dielectric patterns.

5. The device of claim 1, further comprising:
   a source pattern between the substrate and a lowermost one of the intergate dielectric layers; and
   a dummy charge storage pattern in partial contact with a sidewall of the source pattern.

6. The device of claim 1, further comprising a residual tunnel dielectric layer between the vertical semiconductor pattern and the substrate and in simultaneous contact with the vertical semiconductor pattern and the substrate, the residual tunnel dielectric layer spaced apart from the tunnel dielectric layer.

7. The device of claim 1, wherein the plurality of blocking dielectric patterns and the first charge storage patterns protrude toward the vertical semiconductor pattern, compared to sidewalls of the intergate dielectric layers.

8. The device of claim 1, further comprising a second charge storage pattern between the tunnel dielectric layer and the one of the first charge storage patterns, the second charge storage pattern in contact with a top surface and a bottom surface of the one of the first charge storage patterns,
   wherein the second charge storage pattern includes a material different from a material of the first charge storage pattern.

9. The device of claim 8, further comprising a third charge storage pattern between the second charge storage pattern and the tunnel dielectric layer, the third charge storage pattern in contact with a top surface and a bottom surface of the second charge storage pattern,
   wherein the third charge storage pattern includes a material the same as a material of the first charge storage pattern.

10. The device of claim 1, further comprising a plurality of high-k dielectric layers between the electrode layers and the plurality of blocking dielectric patterns, respectively,
    wherein sidewalls of the intergate dielectric layers protrude more than sidewalls of the high-k dielectric layers.

11. The device of claim 1, further comprising a peripheral logic structure below the substrate, the peripheral logic structure electrically connected to at least one of the electrode layers or to the vertical semiconductor pattern.

12. A three-dimensional semiconductor memory device, comprising:
    a substrate on a peripheral logic structure;
    a source pattern on the substrate;
    a plurality of intergate dielectric layers and a plurality of electrode layers alternately stacked on the source pattern;
    a vertical semiconductor pattern that penetrates the intergate dielectric layers, the electrode layers, and the source pattern, the vertical semiconductor pattern extending into the substrate;
    a plurality of blocking dielectric patterns between the vertical semiconductor pattern and corresponding electrode layers, respectively, the plurality of blocking dielectric patterns spaced apart from each other;
    a tunnel dielectric layer between the plurality of blocking dielectric patterns and the vertical semiconductor pattern, the tunnel dielectric layer over the plurality of blocking dielectric patterns and simultaneously with the intergate dielectric layers; and
    a plurality of first charge storage patterns between the plurality of blocking dielectric patterns and the tunnel dielectric layer, respectively, the first charge storage patterns spaced apart from each other,
    wherein one of the first charge storage patterns is in contact with a sidewall of one of the plurality of blocking dielectric patterns and simultaneously with a sidewall of the intergate dielectric layer adjacent to the one of the first charge storage patterns.

13. The device of claim 12, wherein a vertical length of the one of the first charge storage patterns is greater than a vertical length of the one of the plurality of blocking dielectric patterns.

14. The device of claim 12, wherein each of the first charge storage patterns has a C-shaped cross-section.

15. The device of claim 12, further comprising a dummy charge storage pattern in partial contact with a sidewall of the source pattern and spaced apart from the first charge storage patterns.

16. The device of claim 12, further comprising a residual tunnel dielectric layer between the vertical semiconductor pattern and the substrate and in simultaneous contact with the vertical semiconductor pattern and the substrate, the residual tunnel dielectric layer spaced apart from the tunnel dielectric layer.

17. The device of claim 12, wherein the plurality of blocking dielectric patterns and the first charge storage patterns protrude toward the vertical semiconductor pattern, compared to sidewalls of the intergate dielectric layers.

18. The device of claim 12, further comprising a second charge storage pattern between the tunnel dielectric layer and the one of the first charge storage patterns, the second charge storage pattern in contact with a top surface and a bottom surface of the one of the first charge storage patterns,
wherein the second charge storage pattern includes a material different from a material of the first charge storage patterns.

19. The device of claim 12, further comprising a plurality of high-k dielectric layers between the electrode layers and the plurality of blocking dielectric patterns, respectively, wherein sidewalls of the intergate dielectric layers protrude more than sidewalls of the high-k dielectric layers.

20. A three-dimensional semiconductor memory device, comprising:
a plurality of intergate dielectric layers and a plurality of electrode layers alternately stacked on a substrate;
a vertical semiconductor pattern that penetrates the intergate dielectric layers and the electrode layers, the vertical semiconductor pattern extending into the substrate;
a plurality of blocking dielectric patterns between the vertical semiconductor pattern and the electrode layers, respectively, the plurality of blocking dielectric patterns spaced apart from each other;
a tunnel dielectric layer between the plurality of blocking dielectric patterns and the vertical semiconductor pattern, the tunnel dielectric layer over the plurality of blocking dielectric patterns and simultaneously a portion of a vertical surface of the tunnel dielectric layer is in direct contact with a respective one of the plurality of the intergate dielectric layers; and
a plurality of first charge storage patterns between the plurality of blocking dielectric patterns and the tunnel dielectric layer, respectively, the first charge storage patterns spaced apart from each other,
wherein a vertical length of one of the first charge storage patterns is greater than a vertical length of one of the plurality of blocking dielectric patterns, the one of the plurality of blocking dielectric patterns in contact with the one of the first charge storage patterns.

* * * * *